US006667685B2

United States Patent
Wasaki et al.

(10) Patent No.: US 6,667,685 B2
(45) Date of Patent: Dec. 23, 2003

(54) POWER LINE NOISE FILTER

(75) Inventors: Masaru Wasaki, Tokyo (JP); Yoshihiro Saitoh, Tokyo (JP)

(73) Assignee: TDK Corporation, Tokyo (JP)

( * ) Notice: Subject to any disclaimer, the term of this patent is extended or adjusted under 35 U.S.C. 154(b) by 50 days.

(21) Appl. No.: 09/982,944

(22) Filed: Oct. 22, 2001

(65) Prior Publication Data

US 2002/0063474 A1 May 30, 2002

(30) Foreign Application Priority Data

Oct. 31, 2000 (JP) ........................................ 2000-333081

(51) Int. Cl.[7] .............................................. H04M 11/04
(52) U.S. Cl. ............................ 340/310.03; 340/310.01; 340/310.07
(58) Field of Search ................. 340/310.03, 310.05, 340/310.07, 310.01

(56) References Cited

U.S. PATENT DOCUMENTS

| | | | | |
|---|---|---|---|---|
| 4,475,214 A | * | 10/1984 | Gutleber | 375/34 |
| 4,783,817 A | * | 11/1988 | Hamada et al. | 381/71 |
| 6,313,738 B1 | * | 11/2001 | Wynn | 340/310.03 |
| 6,317,031 B1 | * | 11/2001 | Rickard | 340/310.03 |
| 6,329,905 B1 | * | 12/2001 | Cunningham | 340/310.01 |
| 6,373,674 B1 | * | 4/2002 | Sugiura et al. | 361/118 |
| 6,441,723 B1 | * | 8/2002 | Mansfield, Jr. et al. | 340/310.01 |

FOREIGN PATENT DOCUMENTS

| | | |
|---|---|---|
| JP | A 53-54447 | 5/1978 |
| JP | 58-22719 | 8/1981 |
| JP | A-5-153782 | 6/1993 |
| JP | A 5-219758 | 8/1993 |
| JP | A 7-22886 | 1/1995 |
| JP | A 7-22905 | 1/1995 |
| JP | A 7-115339 | 5/1995 |
| JP | A-8-098536 | 4/1996 |
| JP | A 9-102723 | 4/1997 |
| JP | A-10-94244 | 4/1998 |
| JP | A 10-303674 | 11/1998 |
| JP | A-11-196034 | 7/1999 |

* cited by examiner

*Primary Examiner*—Daniel J. Wu
*Assistant Examiner*—Phung Nguyen
(74) *Attorney, Agent, or Firm*—Oliff & Berridge, PLC

(57) ABSTRACT

In a power line noise filter, a detection circuit detecting variations in electric current in two conductive lines of an electric power line, thereby detecting common mode noise that causes a change in electric current in the power line. A phase-inverted signal generation circuit then generates a phase-inverted signal whose is inverted to that of the noise detected by the detection circuit. Further, an injection circuit causes a change in electric current corresponding to the phase-inverted signal, for the two conductive lines of the electric power line. The common mode noise causing a change in electric current in the electric power lines is thereby canceled.

26 Claims, 13 Drawing Sheets

POWER LINE NOISE FILTER

BACKGROUND OF THE INVENTION

1. Field of the Invention

The present invention relates to a power line noise filter that reduces noise in electric power lines.

2. Description of the Related Art

Telecommunications using electric power lines, in which high frequency signals are superposed on electric power lines, is known as one of the telecommunications technologies used at home and office. During the telecommunications using electric power lines, sporadic noises of uncertain frequency bands are generated in electric power lines (hereinafter referred to as the noise) when various electric and electronic devices that are connected to the electric power lines are operated, causing higher error rates and other defects in telecommunications qualities.

A noise generated in an electric power line by operation of a device connected to the electric power line sometimes adversely affects other devices connected to the same line, even when the line is not used for telecommunications.

There are two types of noises generated in electric power lines, namely common mode noises, which propagate through two conductive lines in the same phase, and normal mode noises generated between two conductive lines. Further, noises generated in electric power lines include a noise that causes a change in electric current (hereinafter referred to as a current-related noise), and a noise that causes a change in voltage (hereinafter referred to as a voltage-related noise).

One of the measures against noise problems described above is use of a filter against electromagnetic interference (EMI) (hereinafter referred to as an EMI filter). An EMI filter is generally formed as an LC filter (a filter comprising inductors and capacitors) in which discrete elements such as a common mode choke coil, a normal mode choke coil, an X capacitor and a Y capacitor are used in combination.

Published Unexamined Japanese Patent Application (KOKAI) Heisei 7-115339 discloses a line filter that absorbs noise currents. The line filter has a first transformer including a primary coil and a secondary coil, a second transformer including a primary coil and a secondary coil, and an amplifier that amplifies a noise current that is electromagnetically induced to the secondary coil of the first transformer when the noise current flows into the primary coil of the first transformer. The noise current amplified by the amplifier is allowed to flow into the secondary coil of the second transformer to cause a change in the impedance of the primary coil of the second transformer. According to this line filter, an attenuation effect on noise is increased through adjustment of the impedance of the primary coil of the second transformer.

Published Unexamined Japanese Patent Application (KOKAI) Heisei 10-303674 discloses an AC line filter that reduces noise in an AC power source line. The AC line filter comprises: a common mode choke coil to which a third winding has been added; a noise extraction circuit that extracts common mode noise in the AC power source line; a noise amplifying circuit that amplifies the extracted common mode noise; and an electric current supplying circuit that supplies a current for providing an electromotive force of inverted phase to the third winding of the common mode choke coil in response to outputs of the noise amplifying circuit. According to this AC line filter, the noise extraction circuit extracts common mode noise in the AC power source line, the noise amplifying circuit amplifies the extracted common mode noise, and, in response to the outputs of the noise amplifying circuit, the electric current supplying circuit supplies a current for providing an electromotive force of inverted phase to the third winding of the common mode choke coil. Common mode noise in the AC power source line are thereby reduced.

Conventional EMI filters formed as an LC filter are advantageous in that the circuits can be easily configured, but on the other hand they have drawbacks such as (1) to (3) described below.

(1) Conventional EMI filters can provide a desired attenuation amount only within a narrow frequency band, because those filters have specific resonance frequencies that depend on inductance and capacitance.
(2) EMI filters need to be optimized according to devices that generate noises, because frequency bands, intensity and characteristics of noises generated differ among electric/electronic devices. Thus, a process of trial and error is required each time a device is designed, to optimize EMI filters so that they are compatible with the standards related to noises, which in turn necessitates a long time for measurements and evaluations, and makes standardization of EMI filters difficult.
(3) Since conventional EMI filters can provide a desired attenuation amount only within a narrow frequency band, their noise reduction effect fluctuates due to variations in noise frequencies among different noise sources and differences in attenuation characteristics among EMI filters.

According to the line filter disclosed in Published Unexamined Japanese Patent Application (KOKAI) Heisei 7-115339, the impedance of the primary coil of the second transformer is adjusted by allowing currents which synchronize after a lapse of one cycle with the noise currents detected by the first transformer to flow into the secondary coil of the second transformer. Therefore, this line filter may be effective for reducing continuous noise with a constant frequency, but it is not capable of canceling sporadic noise. FIG. 4 in this reference shows an example of the line filter configuration in which a line is passed around two cores together, with the secondary coil of the first transformer and the secondary coil of the second transformer being wound around the cores respectively. In this configuration, however, the two cores can easily become misaligned, and cabling would be difficult.

According to the AC line filter disclosed in Published Unexamined Japanese Patent Application (KOKAI) Heisei 10-303674, as shown in FIGS. 1 and 2 thereof, common mode noise is detected by detecting variations in voltage in a neutral line through the use of a high path filter (HPF), and the detected common mode noise is amplified by the noise amplifying circuit. Then, in response to outputs of the noise amplifying circuit, the electric current supplying circuit generates a current for providing the third winding of the common mode choke coil with an electromotive force of inverted phase, and supplies the current to the third winding of the common mode choke coil.

Thus, in the above AC line filter, the voltage of the common mode noise (hereinafter referred to as the noise voltage) is detected, and the noise voltage is amplified and then converted into a current having a phase inverted to that of the common mode noise (hereinafter referred to as a phase-inverted current), so as to cancel the common mode noise using the phase-inverted current.

In the above AC line filter, however, a delay of the phase-inverted current against the noise voltage occurs during the processes of amplifying the noise voltage and converting the noise voltage into the phase-inverted current. Further, waveform of the noise voltage and that of the phase-inverted current do not coincide with each other completely. For these reasons, it is difficult to accurately cancel common mode noise in AC power source lines using the above AC line filter.

Basically, the above AC line filter reduces common mode noise using the common mode choke coil, and, enhances the effect of reducing common mode noise by supplying the phase-inverted current to the third winding of the common mode choke coil. Therefore, it is difficult for this AC line filter to reduce noise over a wide frequency band, because its attenuation characteristics depend on the properties of the common mode choke coil.

Further, in the above AC line filter, the HPF for extracting common mode noise is provided between the neutral line and the frame ground, and the third winding for canceling the common mode noise is connected between the frame ground and the electric current supplying circuit. Therefore, the AC line filter would not function when there is no frame ground, and further it is capable of canceling only the common mode noise generated between the frame ground and the neutral line. In other words, this AC line filter is applicable in extremely limited fields.

FIG. 5 of Published Unexamined Japanese Patent Application (KOKAI) Showa 53-54447 shows a filter that blocks carrier waves propagated through an electric power line. The filter has a pair of inputs, a pair of outputs, a parallel resonant circuit placed between one of the inputs and one of the outputs, and a serial resonant circuit placed between the two outputs. According to the parallel resonant circuit of this filter, on the magnetic core, a magnetic flux of a commercial current superposed with high frequency signals is canceled with a magnetic flux of a commercial current from which high frequency signals have been removed with a low-range passage filter, to thereby make impedance larger with respect to the high frequency signals. The principle for blocking carrier waves by this filter differs completely from the principle of noise reduction by a power line noise filter according to the invention detailed later.

OBJECT AND SUMMARY OF THE INVENTION

It is an object of the invention to provide a power line noise filter that can effectively reduce noise in electric power lines over a wide frequency band, and can also effectively reduce sporadic noise as well as continuous noise.

A first power line noise filter according to the invention comprises:
 a noise detection circuit (noise detection means) for detecting a noise in an electric power line by detecting variations in electric current in the electric power line;
 a phase-inverted signal generation circuit (phase-inverted signal generation means) for generating a phase-inverted signal whose phase is inverted to that of the noise detected by the noise detection circuit (noise detection means); and
 a noise cancellation circuit (noise cancellation means) for canceling the noise in the electric power line by causing a change in electric current in the electric power line, the change corresponding to the phase-inverted signal generated by the phase-inverted signal generation circuit (phase-inverted signal generation means).

In the first power line noise filter of the invention, the noise detection circuit (noise detection means) detects noise in an electric power line by detecting variations in electric current in the power line. Then, the phase-inverted signal generation circuit (phase-inverted signal generation means) generates a phase-inverted signal whose phase is inverted to that of the noise detected by the noise detection circuit (noise detection means). Further, the noise cancellation circuit (noise cancellation means) causes a change in electric current in the power line, the change corresponding to the phase-inverted signal, and thereby cancels the noise in the power line.

In the first power line noise filter of the invention, the noise detection circuit (noise detection means) may detect noises propagating through two conductive lines of the electric power line in the same phase, and the noise cancellation circuit (noise cancellation means) may cause the same changes in electric current for the two conductive lines of the electric power line.

Further, in the first power line noise filter of the invention, the noise detection circuit (noise detection means) may detect noise occurring in each of two conductive lines of the electric power line, separately for each of the conductive lines; the phase-inverted signal generation circuit (phase-inverted signal generation means) may generate the phase-inverted signals separately for the two conductive lines, the phase-inverted signals respectively corresponding to the noises detected for the two conductive lines by the noise detection circuit (noise detection means); and the noise cancellation circuit (noise cancellation means) may cause changes in electric current separately for the two conductive lines of the electric power line, the changes respectively corresponding to the phase-inverted signals generated for the two conductive lines by the phase-inverted signal generation circuit (phase-inverted signal generation means).

A second power line noise filter according to the invention comprises:
 a noise detection circuit (noise detection means) for detecting a noise in an electric power line by detecting variations in voltage in the electric power line;
 a phase-inverted signal generation circuit (phase-inverted signal generation means) for generating a phase-inverted signal whose phase is inverted to that of the noise detected by the noise detection circuit (noise detection means); and
 a noise cancellation circuit (noise cancellation means) for canceling the noise in the electric power line by causing a change in voltage in the electric power line, the change corresponding to the phase-inverted signal generated by the phase-inverted signal generation circuit (phase-inverted signal generation means).

In the second power line noise filter of the invention, the noise detection circuit (noise detection means) detects noise in an electric power line by detecting variations in voltage in the power line. Then, the phase-inverted signal generation circuit (phase-inverted signal generation means) generates a phase-inverted signal whose phase is inverted to that of the noise detected by the noise detection circuit (noise detection means). Further, the noise cancellation circuit (noise cancellation means) causes a change in voltage in the power line, the change corresponding to the phase-inverted signal, and thereby cancels the noise in the power line.

In the second power line noise filter of the invention, the noise detection circuit (noise detection means) may detect noises propagating through two conductive lines of the electric power line in the same phase, and the noise cancellation circuit (noise cancellation means) may cause the same changes in voltage for the two conductive lines of the electric power line.

Further, in the second power line noise filter of the invention, the noise detection circuit (noise detection means) may detect noise occurring in each of two conductive lines of the electric power line, separately for each of the conductive lines; the phase-inverted signal generation circuit (phase-inverted signal generation means) may generate the phase-inverted signals separately for the two conductive lines, the phase-inverted signals respectively corresponding to the noises detected for the two conductive lines by the noise detection circuit (noise detection means); and the noise cancellation circuit (noise cancellation means) may cause changes in voltage separately for the two conductive lines of the electric power line, the changes respectively corresponding to the phase-inverted signals generated for the two conductive lines by the phase-inverted signal generation circuit (phase-inverted signal generation means).

A third power line noise filter according to the invention comprises:

- a first noise detection circuit (first noise detection means) for detecting a first noise in an electric power line by detecting variations in electric current in the electric power line;
- a first phase-inverted signal generation circuit (first phase-inverted signal generation means) for generating a first phase-inverted signal whose phase is inverted to that of the first noise detected by the first noise detection circuit (first noise detection means);
- a first noise cancellation circuit (first noise cancellation means) for canceling the first noise in the electric power line by causing a change in electric current in the electric power line, the change corresponding to the first phase-inverted signal generated by the first phase-inverted signal generation circuit (first phase-inverted signal generation means);
- a second noise detection circuit (second noise detection means) for detecting a second noise in the electric power line by detecting variations in voltage in the electric power line;
- a second phase-inverted signal generation circuit (second phase-inverted signal generation means) for generating a second phase-inverted signal whose phase is inverted to that of the second noise detected by the second noise detection circuit (second noise detection means); and
- a second noise cancellation circuit (second noise cancellation means) for canceling the second noise in the electric power line by causing a change in voltage in the electric power line, the change corresponding to the second phase-inverted signal generated by the second phase-inverted signal generation circuit (second phase-inverted signal generation means).

In the third power line noise filter of the invention, the first noise detection circuit (first noise detection means) detects the first noise in an electric power line by detecting variations in electric current in the power line. Then, the first phase-inverted signal generation circuit (first phase-inverted signal generation means) generates the first phase-inverted signal whose phase is inverted to that of the first noise detected by the first noise detection circuit (first noise detection means). Then, the first noise cancellation circuit (first noise cancellation means) causes a change in electric current in the power line, the change corresponding to the first phase-inverted signal, and thereby cancels the first noise in the power line. Further, the second noise detection circuit (second noise detection means) detects the second noise in the electric power line by detecting variations in voltage in the power line. Then, the second phase-inverted signal generation circuit (second phase-inverted signal generation means) generates the second phase-inverted signal whose phase is inverted to that of the second noise detected by the second noise detection circuit (second noise detection means). Then, the second noise cancellation circuit (second noise cancellation means) causes a change in voltage in the power line, the change corresponding to the second phase-inverted signal, and thereby cancels the second noise in the power line.

In the third power line noise filter of the invention, the first noise detection circuit (first noise detection means) may detect first noises propagating through two conductive lines of the electric power line in the same phase; the first noise cancellation circuit (first noise cancellation means) may cause the same changes in electric current for the two conductive lines of the electric power line; the second noise detection circuit (second noise detection means) may detect second noises propagating through two conductive lines of the electric power line in the same phase; and the second noise cancellation circuit (second noise cancellation means) may cause the same changes in voltage for the two conductive lines of the electric power line.

In the third power line noise filter of the invention, the first noise detection circuit (first noise detection means) may detect the first noise occurring in each of two conductive lines of the electric power line, separately for each of the conductive lines; and the first phase-inverted signal generation circuit (first phase-inverted signal generation means) may generate the first phase-inverted signals separately for the two conductive lines, the first phase-inverted signals respectively corresponding to the first noises detected for the two conductive lines by the first noise detection circuit (first noise detection means); the first noise cancellation circuit (first noise cancellation means) may cause changes in electric current separately for the two conductive lines of the electric power line, the changes respectively corresponding to the first phase-inverted signals generated for the two conductive lines by the first phase-inverted signal generation circuit (first phase-inverted signal generation means); the second noise detection circuit (second noise detection means) may detect the second noise occurring in each of two conductive lines of the electric power line, separately for each of the conductive lines; the second phase-inverted signal generation circuit (second phase-inverted signal generation means) may generate the second phase-inverted signals separately for the two conductive lines, the second phase-inverted signals respectively corresponding to the second noises detected for the two conductive lines by the second noise detection circuit (second noise detection means); and the second noise cancellation circuit (second noise cancellation means) may cause changes in voltage separately for the two conductive lines of the electric power line, the changes respectively corresponding to the second phase-inverted signals generated for the two conductive lines by the second phase-inverted signal generation circuit (second phase-inverted signal generation means).

A fourth power line noise filter of the invention comprises:

- a noise detection circuit (noise detection means), provided at a specific position on an electric power line, for detecting noise in the electric power line by detecting variations in electric current or voltage in the electric power line;
- a phase-inverted signal generation circuit (phase-inverted signal generation means) for generating a phase-inverted signal whose phase is inverted to that of the noise detected by the noise detection circuit (noise detection means);

a noise cancellation circuit (noise cancellation means), provided at a position on the electric power line different from that of the noise detection circuit (noise detection means), for canceling the noise in the electric power line by causing a change in electric current in the electric power line corresponding to the phase-inverted signal generated by the phase-inverted signal generation circuit (phase-inverted signal generation means), in the case where the noise detection circuit (noise detection means) detects the noise by detecting variations in electric current in the electric power line; or by causing a change in voltage in the electric power line corresponding to the phase-inverted signal generated by the phase-inverted signal generation circuit (phase-inverted signal generation means), in the case where the noise detection circuit (noise detection means) detects the noise by detecting variations in voltage in the electric power line; and a peak-value-reducing impedance component that is provided between the noise detection circuit (noise detection means) and the noise cancellation circuit (noise cancellation means) on the electric power line, and has an impedance that reduces a peak value of a noise passing therethrough.

In the fourth power line noise filter of the invention, the noise detection circuit (noise detection means) detects noise in an electric power line by detecting variations in electric current or voltage in the power line. Then, the phase-inverted signal generation circuit (phase-inverted signal generation means) generates a phase-inverted signal whose phase is inverted to that of the noise detected by the noise detection circuit (noise detection means). Then, the noise cancellation circuit (noise cancellation means) causes a change in electric current or voltage in the power line, the change corresponding to the phase-inverted signal. Further, in this noise filter, the peak-value-reducing impedance component reduces the peak value of noise on the noise-cancellation-circuit(means)-side of the power line, and, keeps a difference in peak value between the noise on the noise-detection-circuit(means)-side of the power line and the noise on the noise-cancellation-circuit (means)-side of the power line.

In the fourth power line noise filter of the invention, the peak-value-reducing impedance component may include an inductor.

The fourth power line noise filter of the invention may further comprise a phase-adjusting impedance component, the impedance component being provided along a signal path starting from the noise detection circuit (noise detection means) to reach the noise cancellation circuit (noise cancellation means) via the phase-inverted signal generation circuit (phase-inverted signal generation means), and having an impedance that adjusts a phase of the phase-inverted signal such that a phase difference between the noise inputted to the noise cancellation circuit (noise cancellation means) and the change in electric current or voltage in the electric power line caused by the noise cancellation circuit (noise cancellation means) is made closer to 180°. In this case, the phase-adjusting impedance component may include an inductor.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

[First Embodiment]

Figure 1:
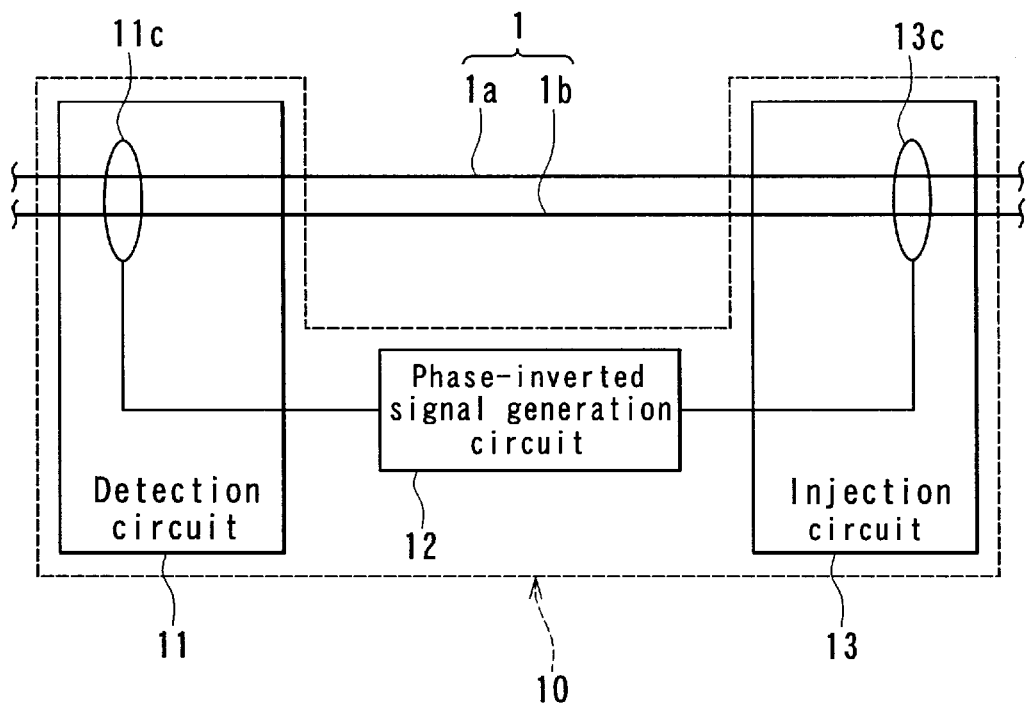
FIG. 1 is a block diagram showing a configuration of a power line noise filter according to a first embodiment of the invention.

FIG. 1 is a block diagram showing a configuration of a power line noise filter according to a first embodiment of the invention. The power line noise filter 10 of the embodiment reduces common mode noise that causes a change in electric current (hereinafter referred to as current-related common mode noise) in an electric power line 1. The electric power line 1 has two conductive lines 1a and 1b. Here, the electric power line 1 may be one that transmits electric power by either alternating or direct currents.

The power line noise filter 10 comprises: a detection circuit 11 for detecting noise in the electric power line 1; a phase-inverted signal generation circuit 12 for generating a phase-inverted signal whose phase is inverted to that of the noise detected by the detection circuit 11; and an injection circuit 13 for injecting the phase-inverted signal generated by the phase-inverted signal generation circuit 12 into the electric power line 1. The detection circuit 11 is placed closer to a noise source than the injection circuit 13. The detection circuit 11 corresponds to the noise detection means or the noise detection circuit of the invention. The phase-inverted signal generation circuit 12 corresponds to the phase-inverted signal generation means or the phase-inverted signal generation circuit of the invention. The injection circuit 13 corresponds to the noise cancellation means or the noise cancellation circuit of the invention.

The detection circuit 11 detects noise in the electric power line 1 by detecting variations in electric current in the two conductive lines 1a and 1b of the electric power line 1. Further, the detection circuit 11 detects noises that propagate through the two conductive lines 1a and 1b in the same phase. Therefore, the detection circuit 11 detects current-related common mode noise in the electric power line 1.

FIG. 1 shows an example of a configuration of the detection circuit 11. In this example, the detection circuit 11 has a core that surrounds the two conductive lines 1a and 1b, and a coil 11c wound around the core. The detection circuit 11 detects high frequency components among variations in electric current in the conductive lines 1a and 1b, by means of an electric current induced in the coil 11c. The core is made of a magnetic material such as ferrite, Permalloy and an amorphous magnetic material. The detection circuit 11 need not use the coil 11c, but may use, instead of the coil 11c, an electric current sensor including a magnetic sensor that detects magnetic fields generated by electric currents, for example. In this case, a magnetic sensor having a sensor head, including a core made of a magnetic material such as ferrite, Permalloy, and an amorphous magnetic material, and a coil wound around the core, or a magnetoresistive (MR) element that utilizes magnetoresistive effects, or a giant magnetoresistive (GMR) element that utilizes giant magnetoresistive effects, or the like, may be used as the magnetic sensor.

The injection circuit 13 causes a change in electric current in the electric power line 1, the change corresponding to the phase-inverted signal generated by the phase-inverted signal generation circuit 12, and thereby injects the phase-inverted signal generated by the circuit 12 into the electric power line 1, thereby canceling the noise in the electric power line 1. The injection circuit 13 causes the same changes in electric current in the two conductive lines 1a and 1b of the electric power line 1, the changes corresponding to the phase-inverted signals. Thus, the injection circuit 13 cancels the current-related common mode noise in the electric power line 1.

FIG. 1 shows an example of a configuration of the injection circuit 13. In this example, the injection circuit 13 has a core that surrounds the two conductive lines 1a and 1b, and a coil 13c wound around the core. By feeding an electric current to the coil 13, the injection circuit 13 causes the same changes in electric current in the conductive lines 1a and 1b corresponding to the phase-inverted signal.

Figure 2:
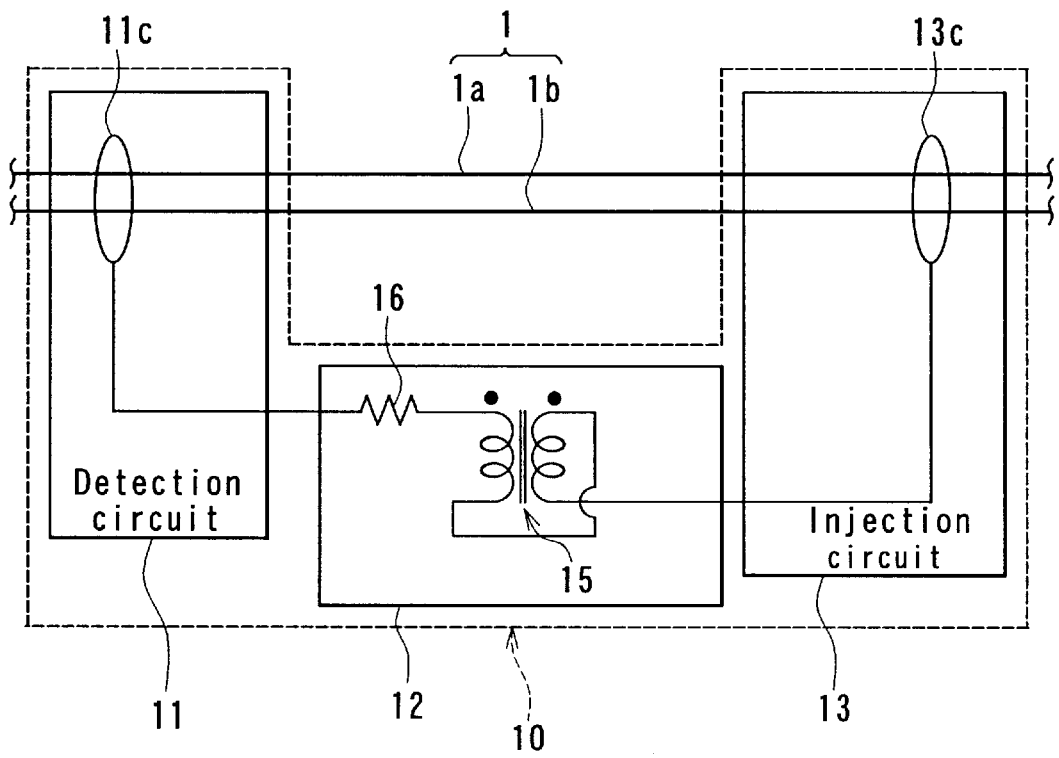
FIG. 2 is a circuit diagram showing an example of a configuration of a phase-inverted signal generation circuit in FIG. 1.

FIG. 2 is a circuit diagram showing an example of a configuration of the phase-inverted signal generation circuit 12 of FIG. 1. The phase-inverted signal generation circuit 12 of this example has a transformer 15. An end of the primary winding of the transformer 15 is connected to an end of the coil 11c of the detection circuit 11 via a resistor 16. The other end of the primary winding of the transformer 15 is connected to the ground (signal ground) of the circuit, together with an end of the secondary winding of the transformer 15. The other end of the secondary winding of the transformer 15 is connected to an end of the coil 13c of the injection circuit 13. The other end of the coil 11c and the other end of the coil 13c are connected to the ground of the circuit. According to the phase-inverted signal generation circuit 12, an electric current corresponding to the noise detected by the coil 11c of the detection circuit 11 flows through the primary winding of the transformer 15, and, in response thereto, an electric current having a phase inverted to that of the noise flows through the coil 13c of the injection circuit 13 connected to the secondary winding of the transformer 15.

Next, functions of the power line noise filter 10 of this embodiment will be described. In the power line noise filter 10, the detection circuit 11 detects current-related common mode noise in the electric power line 1 by detecting variations in electric current in the conductive lines 1a and 1b of the electric power line 1. Then, the phase-inverted signal generation circuit 12 generates a phase-inverted signal whose phase is inverted to that of the noise detected by the detection circuit 11. Further, the injection circuit 13 causes the same changes in electric current in the two conductive lines 1a and 1b of the electric power line 1, the changes corresponding to the phase-inverted signal. The current-related common mode noise in the electric power line 1 is thereby canceled.

As described above, the power line noise filter 10 of this embodiment detects noise in the electric power line 1, generates a phase-inverted signal whose phase is inverted to that of the detected noise, and injects the phase-inverted signal into the electric power line 1, thereby canceling the noise. Noise in the power line 1 is thus reduced. Therefore, the power line noise filter 10 is capable, ideally, of reducing noise irrespective of level or frequency band of the noise.

According to the power line noise filter 10 of this embodiment, noise in the electric power line 1 is detected by detecting variations in electric current in the electric power line 1, and the noise in the electric power line 1 is canceled by causing a change in electric current in the power line 1, the change corresponding to the phase-inverted signal. Therefore, the noise filter 10 neither amplifies the voltage of noise nor converts the voltage of noise into a current of inverted phase. Delay of the phase-inverted signal against noise, and difference in waveform of the phase-inverted signal from the waveform of the noise can therefore be minimized. Accordingly, the power line noise filter 10 is capable of canceling noise with high accuracy. Moreover, since delay of the phase-inverted signal against noise can be minimized, the power line noise filter 10 is capable of canceling not only continuous noise but also sporadic noise.

From the foregoing, according to the power line noise filter 10 it is possible to effectively reduce noise in the electric power line 1 over a wide frequency band, and is also possible to effectively reduce sporadic noise as well as continuous noise.

In addition, the power line noise filter 10 of this embodiment functions uniformly, irrespective of the frequency band, level or nature of noise. Therefore, optimization procedures would not be necessary to suit different noise-generating devices, if the power line noise filter 10 is used. Further, standardization of the power line noise filter 10 would be easy.

Next, three examples of use of the power line noise filter 10 of the embodiment are described with reference to FIG. 3 through FIG. 5.

Figure 3:
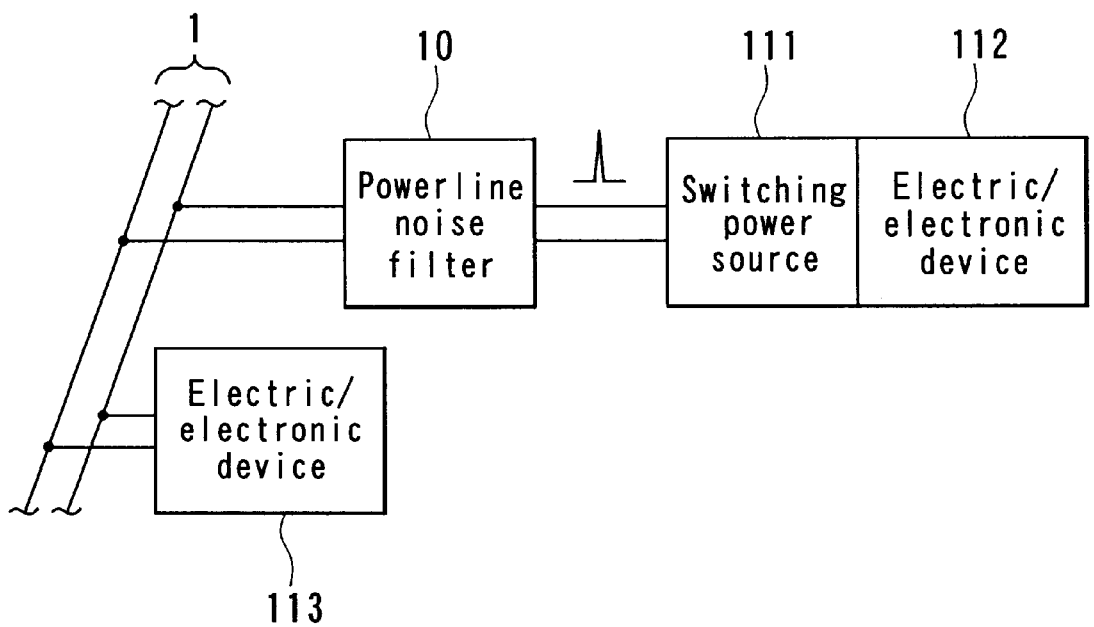
FIG. 3 is an explanatory diagram showing an example of use of the power line noise filter of the first embodiment of the invention.

FIG. 3 shows a first example of use of the power line noise filter 10. This is an example in which the power line noise filter 10 is placed at the power receiving portion of a device that is a source of noise. In the system shown in FIG. 3, an electric/electronic device 112 is connected to the electric power line 1 via a switching power source 111, and another electric/electronic device 113 is also connected to the power line 1. In such a system, the switching power source 111 being a source of noise, the noise originating from the switching power source 111 may be transmitted to the electric/electronic device 113 via the electric power line 1, to adversely affect the electric/electronic device 113. Examples of electric/electronic device 113 that may be adversely affected by noise include audio-visual, information and medical equipment.

Therefore, in the first example, the power line noise filter 10 is placed at the power receiving portion of the switching power source 111 as a source of noise. Thus, the noise originating from the switching power source 111 is reduced, thereby preventing the noise in the electric power line 1 from adversely affecting the other electric/electronic device 113 connected to the electric power line 1.

The first example shown in FIG. 3 is also applicable to telecommunications systems using electric power lines. Here, it is assumed for FIG. 3 that a telecommunications system using electric power lines has several devices, including the electric/electronic device 113, connected to the electric power line 1 as devices used for telecommunications via electric power lines. In such a system, if the power line noise filter 10 is placed at the power receiving portion of the switching power source 111 as a source of noise, it would be possible to prevent noise generated by the switching power source 111 from adversely affecting telecommunications using the electric power line 1. Thus, stable telecommunications environment can be configured.

Figure 4:
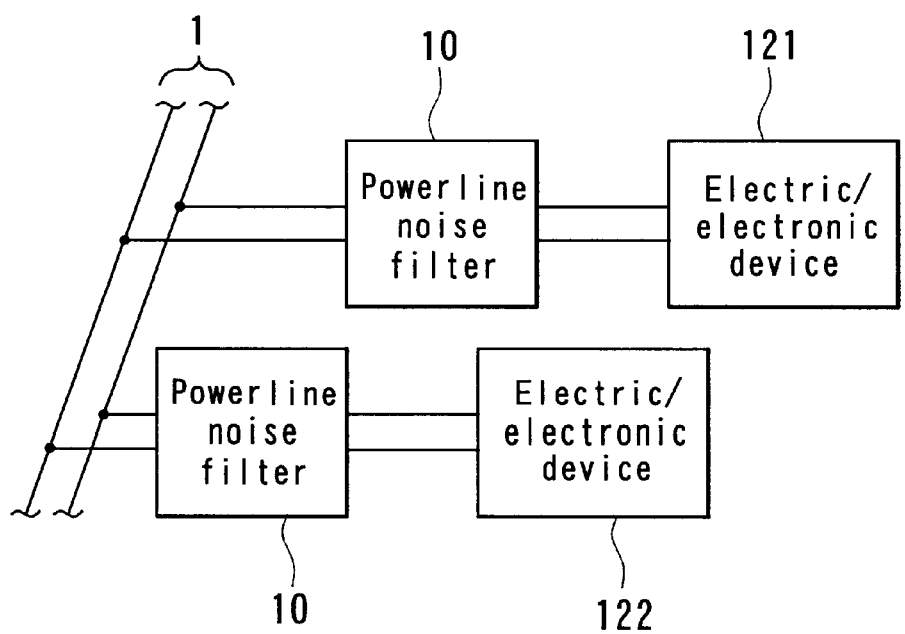
FIG. 4 is an explanatory diagram showing another example of use of the power line noise filter of the first embodiment of the invention.

FIG. 4 shows a second example of use of the power line noise filter 10. In the second example, the power line noise filter 10 is placed at the power receiving portion of a device for which one wishes to eliminate adverse effects of noise in an electric power line. In the system shown in FIG. 4, a plurality of electric/electronic devices 121 and 122, for which one wishes to eliminate adverse effects of noise in the electric power line 1, are connected to the electric power line 1. Thus, in the second example, the power line noise filter 10 is placed at the power receiving portion of each of the devices 121 and 122. This way, it is possible to prevent noise in the electric power line 1 from adversely affecting the devices 121 and 122, irrespective of the frequency band, level and nature of noise occurring in the electric power line 1. The second example is applicable for a wide variety of purposes, including noise prevention measures for audio-visual, information and medical equipment.

Figure 5:
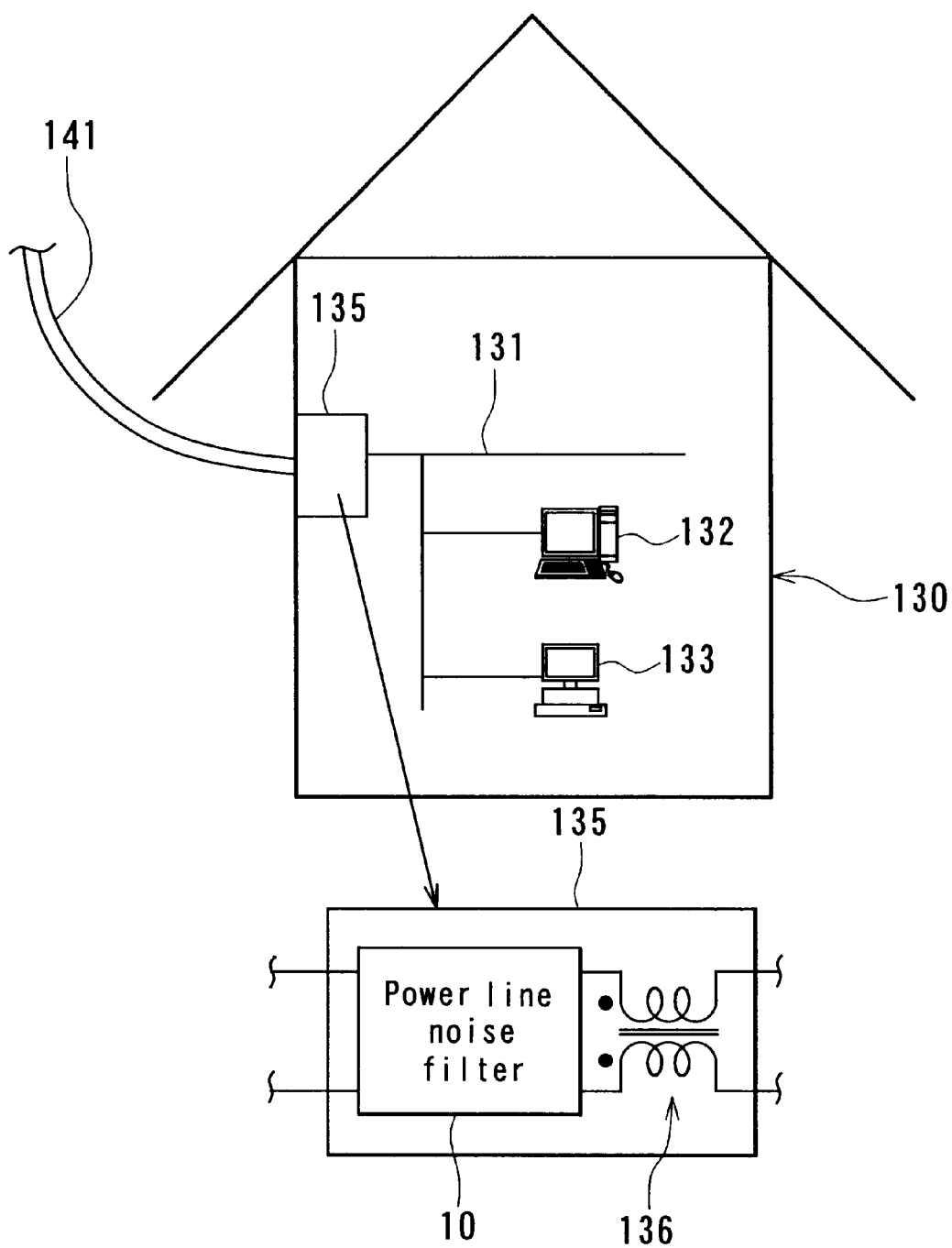
FIG. 5 is an explanatory diagram showing still another example of use of the power line noise filter of the first embodiment of the invention.

FIG. 5 shows a third example of use of the power line noise filter 10. In the third example, the power line noise filter 10 is used as a blocking filter for a telecommunications system using electric power lines. In the system shown in FIG. 5, a plurality of devices 132 and 133 used for telecommunications via electric power lines are connected to an indoor electric power line 131 in a house 130. Further, a blocking filter 135 is placed between the indoor electric power line 131 and an outdoor electric power line 141. The blocking filter 135 is a filter used to prevent the leakage of telecommunications signals in the indoor electric power line 131 into the outdoor electric power line 141, and also to prevent noise in the outdoor electric power line 141 from entering the indoor electric power line 131.

The blocking filter 135 has the power line noise filter 10 of this embodiment, and a common mode choke coil 136 connected to the indoor side of the power line noise filter 10. Here, the common mode choke coil 136 is provided for increasing impedance with respect to frequency of telecommunications signals, so as to prevent attenuation of telecommunications signals during telecommunications via electric power lines.

According to the third example, it is possible to prevent telecommunications signals in the indoor electric power line 131 from leaking into the outdoor electric power line 141, and to prevent noise in the outdoor electric power line 141 from entering the indoor electric power line 131.

[Second Embodiment]

Figure 6:
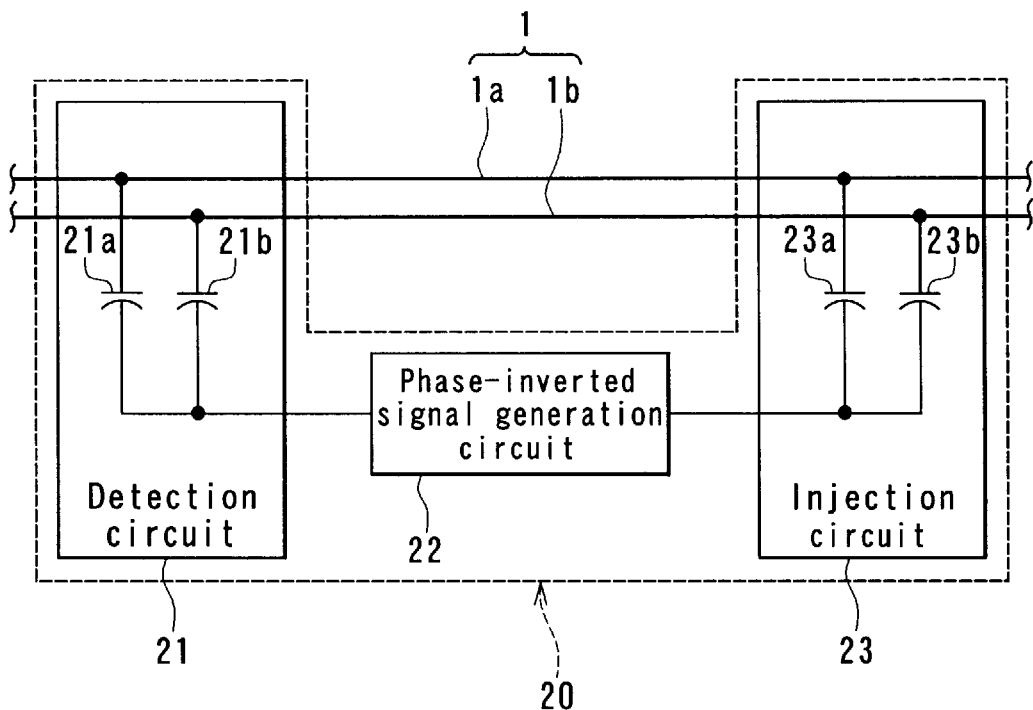
FIG. 6 is a block diagram showing a configuration of a power line noise filter according to a second embodiment of the invention.

FIG. 6 is a block diagram showing a configuration of a power line noise filter according to a second embodiment of the invention. The power line noise filter 20 of this embodiment reduces common mode noise that causes a change in voltage (hereinafter referred to as voltage-related common mode noise) in the electric power line 1.

The power line noise filter 20 comprises: a detection circuit 21 for detecting noise in the electric power line 1; a phase-inverted signal generation circuit 22 for generating a phase-inverted signal whose phase is inverted to that of the noise detected by the detection circuit 21; and an injection circuit 23 for injecting the phase-inverted signal generated by the phase-inverted signal generation circuit 22 into the electric power line 1. The detection circuit 21 is placed closer to a noise source than the injection circuit 23. The detection circuit 21 corresponds to the noise detection means or the noise detection circuit of the invention. The phase-inverted signal generation circuit 22 corresponds to the phase-inverted signal generation means or the phase-inverted signal generation circuit of the invention. The injection circuit 23 corresponds to the noise cancellation means or the noise cancellation circuit of the invention.

The detection circuit 21 detects noise in the electric power line 1 by detecting variations in voltage in the two conductive lines 1a and 1b of the electric power line 1. Further, the detection circuit 21 detects noises that propagate through the two conductive lines 1a and 1b in the same phase. Thus, the detection circuit 21 detects voltage-related common mode noise in the electric power line 1.

FIG. 6 shows an example of a configuration of the detection circuit 21. In this example, the detection circuit 21 has a condenser (capacitor) 21a and a condenser 21b. An end of the condenser 21a is connected to the conductive line 1a, and the other end is connected to an input of the phase-inverted signal generation circuit 22. An end of the condenser 21b is connected to the conductive line 1b, and the other end is connected to the input of the phase-inverted signal generation circuit 22. The condensers 21a and 21b allow high frequency components to pass, among variations in voltage of the conductive lines 1a and 1b, respectively, while blocking low frequency components including a frequency of alternating current of electric power.

The phase-inverted signal generation circuit 22 has a configuration similar to that of the phase-inverted signal generation circuit 12 shown in FIG. 2, for example.

The injection circuit 23 causes a change in voltage in the electric power line 1, the change corresponding to the phase-inverted signal generated by the phase-inverted signal generation circuit 22, and thereby injects the phase-inverted signal generated by the circuit 22 into the electric power line 1, thereby canceling the noise in the electric power line 1. The injection circuit 23 causes the same changes in voltage in the two conductive lines 1a and 1b of the electric power line 1, the changes corresponding to the phase-inverted signals. Thus, the injection circuit 13 cancels the voltage-related common mode noise in the electric power line 1.

FIG. 6 shows an example of a configuration of the injection circuit 23. In this example, the injection circuit 23 has a condenser 23a and a condenser 23b. An end of the condenser 23a is connected to an output of the phase-inverted signal generation circuit 22, and the other end is connected to the conductive line 1a. An end of the condenser 23b is connected to the output of the phase-inverted signal generation circuit 22, and the other end is connected to the conductive line 1b. In this example, the injection circuit 23 causes the same changes in voltage in the conductive lines 1a and 1b corresponding to the phase-inverted signal, via the condensers 23a and 23b.

In the power line noise filter 20 of this embodiment, the detection circuit 21 detects voltage-related common mode noise in the electric power line 1 by detecting variations in voltage in the conductive lines 1a and 1b of the electric power line 1. Then, the phase-inverted signal generation circuit 22 generates a phase-inverted signal whose phase is inverted to that of the noise detected by the detection circuit 21. Further, the injection circuit 23 causes the same changes in voltage in the two conductive lines 1a and 1b of the electric power line 1, the changes corresponding to the phase-inverted signal. The voltage-related common mode noise in the electric power line 1 is thereby canceled.

According to the power line noise filter 20 of this embodiment, noise in the electric power line 1 is detected by detecting variations in voltage in the electric power line 1, and the noise in the electric power line 1 is canceled by causing a change in voltage in the electric power line 1, the change corresponding to the phase-inverted signal. Therefore, the noise filter 20 neither amplifies the voltage of noise nor converts the voltage of noise into a current of inverted phase. Delay of the phase-inverted signal against noise, and difference in waveform of the phase-inverted signal from the waveform of the noise can therefore be minimized. Accordingly, the power line noise filter 20 is capable of canceling noise with high accuracy.

Other configurations, functions and effects of the second embodiment are the same as those of the first embodiment. Moreover, the examples of use of the power line noise filter 10 shown in the first embodiment are also applicable to the power line noise filter 20 of the second embodiment.

[Third Embodiment]

Figure 7:
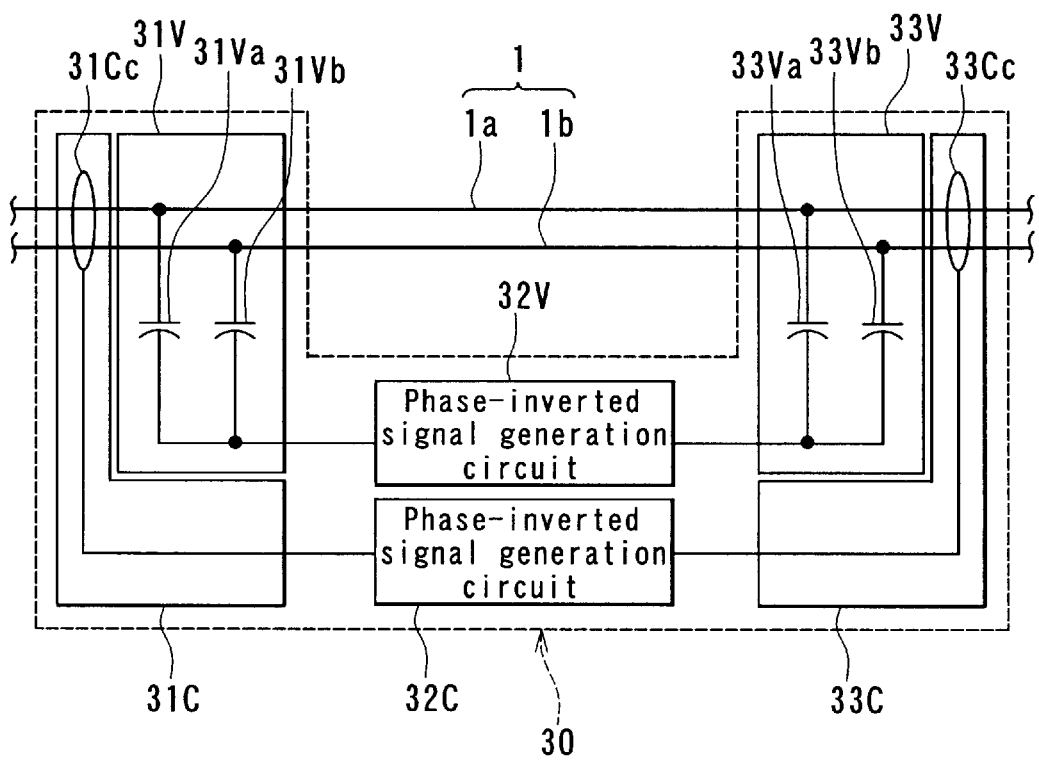
FIG. 7 is a block diagram showing a configuration of a power line noise filter according to a third embodiment of the invention.

FIG. 7 is a block diagram showing a configuration of a power line noise filter according to a third embodiment of the invention. The power line noise filter 30 of this embodiment reduces both current-related common mode noise and voltage-related common mode noise in the electric power line 1.

The power line noise filter 30 comprises: two detection circuits 31C and 31V for detecting noises in the electric power line 1; two phase-inverted signal generation circuits 32C and 32V for generating phase-inverted signals whose phases are inverted to those of the noises detected by the detection circuits 31C and 31V, respectively; and two injection circuits 33C and 33V for injecting the phase-inverted signals generated by the phase-inverted signal generation circuits 32C and 32V, respectively, into the electric power line 1. The detection circuits 31C and 31V are placed closer to a noise source than the injection circuits 33C and 33V.

The detection circuit 31C corresponds to the first noise detection means or the first noise detection circuit of the invention. The phase-inverted signal generation circuit 32C corresponds to the first phase-inverted signal generation means or the first phase-inverted signal generation circuit of the invention. The injection circuit 33C corresponds to the first noise cancellation means or the first noise cancellation circuit of the invention. The detection circuit 31V corresponds to the second noise detection means or the second noise detection circuit of the invention. The phase-inverted signal generation circuit 32V corresponds to the second phase-inverted signal generation means or the second phase-inverted signal generation circuit of the invention. The injection circuit 33V corresponds to the second noise cancellation means or the second noise cancellation circuit of the invention.

The detection circuit 31C detects noises that propagate through the two conductive lines 1a and 1b of the electric power line 1 in the same phase, by detecting variations in electric current in the two conductive lines 1a and 1b. Therefore, the detection circuit 31C detects current-related common mode noise in the electric power line 1. The noise detected by the detection circuit 31C corresponds to the first noise of the invention.

The detection circuit 31V detects noises that propagate through the two conductive lines 1a and 1b of the electric power line 1 in the same phase, by detecting variations in voltage in the two conductive lines 1a and 1b. Thus, the detection circuit 31V detects voltage-related common mode noise in the electric power line 1. The noise detected by the detection circuit 31V corresponds to the second noise of the invention.

FIG. 7 shows an example of configurations of the detection circuits 31C and 31V. In this example, the detection circuit 31C has a core that surrounds the two conductive lines 1a and 1b, and a coil 31Cc wound around the core. An end of the coil 31Cc is connected to an input of the phase-inverted signal generation circuit 32C, and the other end is connected to the ground of the circuit. The detection circuit 31C detects high frequency components among variations in electric current in the conductive lines 1a and 1b, by means of an electric current induced in the coil 31Cc. The detection circuit 31V has a condenser 31Va and a condenser 31Vb. An end of the condenser 31Va is connected to the conductive line 1a, and the other end is connected to an input of the phase-inverted signal generation circuit 32V. An end of the condenser 31Vb is connected to the conductive line 1b, and the other end is connected to the input of the phase-inverted signal generation circuit 32V. The condensers 31Va and 31Vb allow high frequency components to pass, among variations in voltage of the conductive lines 1a and 1b, respectively, while blocking low frequency components including frequencies of alternating currents.

The phase-inverted signal generation circuit 32C generates a phase-inverted signal whose phase is inverted to that of the current-related common mode noise detected by the detection circuit 31C, whereas the phase-inverted signal generation circuit 32V generates a phase-inverted signal whose phase is inverted to that of the voltage-related common mode noise detected by the detection circuit 31V. The phase-inverted signal generated by the phase-inverted signal generation circuit 32C corresponds to the first phase-inverted signal of the invention. The phase-inverted signal generated by the phase-inverted signal generation circuit 32V corresponds to the second phase-inverted signal of the invention. The phase-inverted signal generation circuits 32C and 32V each have the same configuration as that of the phase-inverted signal generation circuit 12 shown in FIG. 2, for example.

The injection circuit 33C causes the same changes in electric current in the two conductive lines 1a and 1b of the electric power line 1, the changes corresponding to the phase-inverted signal generated by the phase-inverted signal generation circuit 32C, and thereby injects the phase-inverted signal generated by the circuit 32C into the electric power line 1, thereby canceling the current-related common mode noise in the electric power line 1. The injection circuit 33V causes the same changes in voltage in the two conductive lines 1a and 1b of the electric power line 1, the changes corresponding to the phase-inverted signal generated by the phase-inverted signal generation circuit 32V, and thereby injects the phase-inverted signal generated by the circuit 32V into the electric power line 1, thereby canceling the voltage-related common mode noise in the electric power line 1.

FIG. 7 shows an example of configurations of the injection circuits 33C and 33V. In this example, the injection circuit 33C has a core that surrounds the two conductive lines 1a and 1b, and a coil 33Cc wound around the core. An end of the coil 33Cc is connected to an output of the phase-inverted signal generation circuit 32C, and the other end is connected to the ground of the circuit. In this example, by feeding a current to the coil 33Cc, the injection circuit 33C causes the same changes in electric current in the conductive lines 1a and 1b corresponding to the phase-inverted signal generated by the phase-inverted signal generation circuit 32C.

In this example, the injection circuit 33V has a condenser 33Va and a condenser 33Vb. An end of the condenser 33Va is connected to an output of the phase-inverted signal generation circuit 32V, and the other end is connected to the conductive line 1a. An end of the condenser 33Vb is connected to the output of the phase-inverted signal generation circuit 32V, and the other end is connected to the conductive line 1b. In this example, the injection circuit 33V causes the same changes in voltage in the conductive lines 1a and 1b corresponding to the phase-inverted signal generated by the inverted-signal generation circuit 32V, via the condensers 33Va and 33Vb.

In the power line noise filter 30 of this embodiment, the detection circuit 31C detects current-related common mode noise in the electric power line 1 by detecting variations in electric current in the conductive lines 1a and 1b of the power line 1. On the other hand, the detection circuit 31V detects voltage-related common mode noise in the electric power line 1 by detecting variations in voltage in the conductive lines 1a and 1b of the power line 1.

Then, the phase-inverted signal generation circuit 32C generates a phase-inverted signal whose phase is inverted to that of the current-related common mode noise detected by the detection circuit 31C. On the other hand, the phase-inverted signal generation circuit 32V generates a phase-inverted signal whose phase is inverted to that of the voltage-related common mode noise detected by the detection circuit 31V.

Further, the injection circuit 33C causes the same changes in electric current in the two conductive lines 1a and 1b corresponding to the phase-inverted signal generated by the phase-inverted signal generation circuit 32C. On the other hand, the injection circuit 33V causes the same changes in voltage in the two conductive lines 1a and 1b corresponding to the phase-inverted signal generated by the phase-inverted signal generation circuit 32V. The current-related common mode noise and the voltage-related common mode noise in the power line 1 are thereby canceled.

According to the power line noise filter 30 of this embodiment, current-related noise in the electric power line 1 is detected by detecting variations in electric current in the electric power line 1, and the current-related noise in the electric power line 1 is canceled by causing a change in electric current in the electric power line 1, the change corresponding to the phase-inverted signal whose phase is inverted to that of the current-related noise. On the other hand, according to the power line noise filter 30, voltage-related noise in the electric power line 1 is detected by detecting variations in voltage in the electric power line 1, and the voltage-related noise in the electric power line 1 is canceled by causing a change in voltage in the electric power line 1, the change corresponding to the phase-inverted signal whose phase is inverted to that of the voltage-related noise. Therefore, the noise filter 30 neither amplifies the voltage of noise nor converts the voltage of noise into a current of inverted phase. Delay of the phase-inverted signal against noise, and difference in waveform of the phase-inverted signal from the waveform of the noise can therefore be minimized. Accordingly, the power line noise filter 30 is capable of canceling noise with high accuracy.

Other configurations, functions and effects of the third embodiment are the same as those of the first embodiment. Moreover, the examples of use of the power line noise filter 10 shown in the first embodiment are also applicable to the power line noise filter 30 of the third embodiment.

[Fourth Embodiment]

Figure 8:
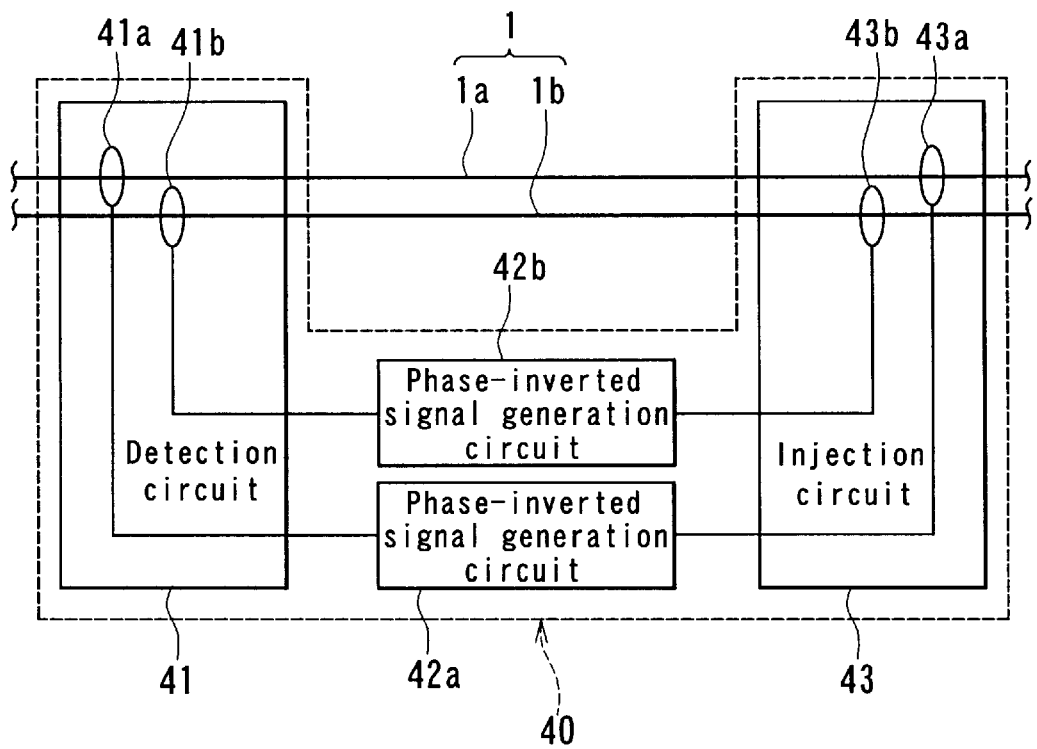
FIG. 8 is a block diagram showing a configuration of a power line noise filter according to a fourth embodiment of the invention.

FIG. 8 is a block diagram showing a configuration of a power line noise filter according to a fourth embodiment of the invention. The power line noise filter 40 of this embodiment reduces normal mode noise that causes change in electric current (hereinafter referred to as current-related normal mode noise) and current-related common mode noise in the electric power line 1.

The power line noise filter 40 comprises: a detection circuit 41 for detecting noise in each of the two conductive lines 1a and 1b of the electric power line 1; two phase-inverted signal generation circuits 42a and 42b for generating phase-inverted signals whose phases are inverted to those of the noises detected by the detection circuit 41 for the lines 1a and 1b, respectively; and an injection circuit 43 for injecting the phase-inverted signals generated by the phase-inverted signal generation circuits 42a and 42b into the conductive lines 1a and 1b, respectively. The detection circuit 41 is placed closer to a noise source than the injection circuit 43. The detection circuit 41 corresponds to the noise detection means or the noise detection circuit of the invention. The phase-inverted signal generation circuits 42a and 42b correspond to the phase-inverted signal generation means or the phase-inverted signal generation circuit of the invention. The injection circuit 43 corresponds to the noise cancellation means or the noise cancellation circuit of the invention.

The detection circuit 41 detects noise occurring in each of the conductive lines 1a and 1b, separately for each of the conductive lines, by detecting variations in electric current in each of the conductive lines 1a and 1b. Thus, the detection circuit 41 detects current-related normal mode noise in the electric power line 1.

FIG. 8 shows an example of a configuration of the detection circuit 41. In this example, the detection circuit 41 has: a core that surrounds the conductive line 1a and a coil 41a wound around the core; and, a core that surrounds the conductive line 1b and a coil 41b wound around the core. An end of the coil 41a is connected to an input of the phase-inverted signal generation circuit 42a, and the other end is connected to the ground of the circuit. An end of the coil 41b is connected to an input of the phase-inverted signal generation circuit 42b, and the other end is connected to the ground of the circuit. The detection circuit 41 detects high frequency components among variations in electric current in the conductive line 1a by means of an electric current induced in the coil 41a, and detects high frequency components among variations in electric current in the conductive line 1b by means of an electric current induced in the coil 41b.

The phase-inverted signal generation circuit 42a generates a phase-inverted signal whose phase is inverted to that of the noise in the conductive line 1a detected by the detection circuit 41, whereas the phase-inverted signal generation circuit 42b generates a phase-inverted signal whose phase is inverted to that of the noise in the conductive line 1b detected by the detection circuit 41. The phase-inverted signal generation circuits 42a and 42b each have the same configuration as that of the phase-inverted signal generation circuit 12 shown in FIG. 2, for example.

The injection circuit 43 causes a change in electric current in the conductive line 1a, the change corresponding to the phase-inverted signal generated by the phase-inverted signal generation circuit 42a, and thereby injects the phase-inverted signal generated by the circuit 42a into the conductive line 1a, thereby canceling the noise in the conductive line 1a. The injection circuit 43 also causes a change in electric current in the conductive line 1b, the change corresponding to the phase-inverted signal generated by the phase-inverted signal generation circuit 42b, and thereby injects the phase-inverted signal generated by the circuit 42b into the conductive line 1b, thereby canceling the noise in the conductive line 1b. Thus, the injection circuit 43 cancels the current-related normal mode noise in the electric power line 1.

FIG. 8 shows an example of a configuration of the injection circuit 43. In this example, the injection circuit 43 has: a core that surrounds the conductive line 1a and a coil 43a wound around the core; and a core that surrounds the conductive line 1b and a coil 43b wound around the core. An end of the coil 43a is connected to an output of the phase-inverted signal generation circuit 42a, and the other end is connected to the ground of the circuit. An end of the coil 43b is connected to an output of the phase-inverted signal generation circuit 42b, and the other end is connected to the ground of the circuit. In this example, by feeding electric currents to the coils 43a and 43b, the injection circuit 43 causes changes in electric current in the conductive lines 1a and 1b respectively, the changes corresponding to the phase-inverted signals generated by the phase-inverted signal generation circuits 42a and 42b, respectively.

In the power line noise filter 40 of this embodiment, the detection circuit 41 detects variations in electric current in each of the conductive lines 1a and 1b, to thereby detect noise occurring in each of the conductive lines 1a and 1b, separately for each of the conductive lines 1a and 1b. Current-related normal mode noise in the electric power line 1 is thereby detected. Then, the phase-inverted signal generation circuits 42a and 42b generate phase-inverted signals whose phases are inverted to those of the noises in the conductive lines 1a and 1b, respectively, detected by the detection circuit 41. Further, the injection circuit 43 causes changes in electric current, separately for the two conductive lines 1a and 1b, the changes corresponding to the respective phase-inverted signals. The current-related normal mode noise in the electric power line 1 is thereby canceled. In addition, according to the embodiment, current-related common mode noise in the electric power line 1 is also canceled, because noises in the conductive lines 1a and 1b are detected and canceled separately for each of the two conductive lines.

According to the power line noise filter 40 of this embodiment, noises in the electric power line 1 are detected by detecting variations in electric current in the electric power line 1, and the noises in the electric power line 1 are canceled by causing changes in electric current in the electric power line 1 corresponding to the phase-inverted signals. Therefore, the noise filter 40 neither amplifies the voltage of noise nor converts the voltage of noise into a current of inverted phase. Delay of the phase-inverted signal against noise, and difference in waveform of the phase-inverted signal from the waveform of the noise can therefore be minimized. Accordingly, the power line noise filter 40 is capable of canceling noise with high accuracy.

Other configurations, functions and effects of the fourth embodiment are the same as those of the first embodiment. Moreover, the examples of use of the power line noise filter 10 shown in the first embodiment are also applicable to the power line noise filter 40 of the fourth embodiment.

[Fifth Embodiment]

Figure 9:
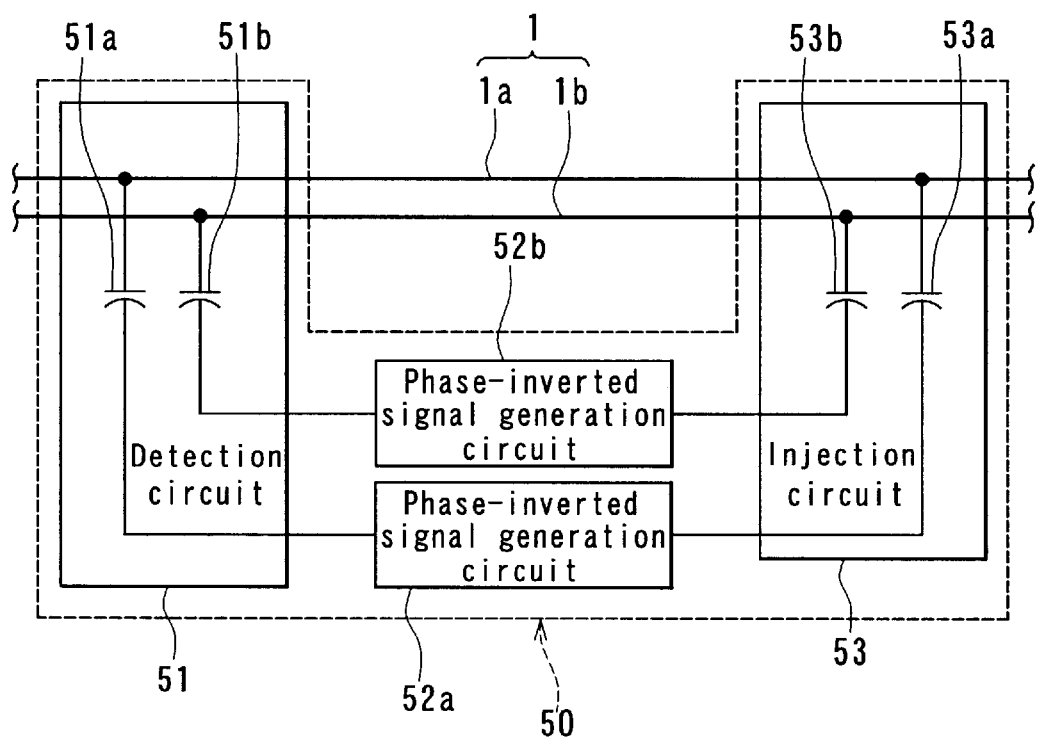
FIG. 9 is a block diagram showing a configuration of a power line noise filter according to a fifth embodiment of the invention.

FIG. 9 is a block diagram showing a configuration of a power line noise filter according to a fifth embodiment of the invention. The power line noise filter 50 of this embodiment reduces normal mode noise that causes a change in voltage (hereinafter referred to as voltage-related normal mode noise) and voltage-related common mode noise in the electric power line 1.

The power line noise filter 50 comprises: a detection circuit 51 for detecting noise in each of the two conductive lines 1a and 1b of the electric power line 1; two phase-inverted signal generation circuits 52a and 52b for generating phase-inverted signals whose phases are inverted to those of the noises detected by the detection circuit 51 for the lines 1a and 1b, respectively; and an injection circuit 53 for injecting the phase-inverted signals generated by the phase-inverted signal generation circuits 52a and 52b into the conductive lines 1a and 1b, respectively. The detection circuit 51 is placed closer to a noise source than the injection circuit 53. The detection circuit 51 corresponds to the noise detection means or the noise detection circuit of the invention. The phase-inverted signal generation circuits 52a and 52b correspond to the phase-inverted signal generation means or the phase-inverted signal generation circuit of the invention. The injection circuit 53 corresponds to the noise cancellation means or the noise cancellation circuit of the invention.

The detection circuit 51 detects noise occurring in each of the conductive lines 1a and 1b, separately for each of the conductive lines, by detecting variations in voltage in each of the conductive lines 1a and 1b. Thus, the detection circuit 51 detects voltage-related normal mode noise in the electric power line 1.

FIG. 9 shows an example of a configuration of the detection circuit 51. In this example, the detection circuit 51 has a condenser 51a and a condenser 51b. An end of the condenser 51a is connected to the conductive line 1a, and the other end is connected to an input of the phase-inverted signal generation circuit 52a. An end of the condenser 51b is connected to the conductive line 1b, and the other end is connected to an input of the phase-inverted signal generation circuit 52b. The condensers 51a and 51b allow high frequency components to pass, among variations in voltage in the conductive lines 1a and 1b, respectively, while blocking low frequency components including frequencies of alternating currents.

The phase-inverted signal generation circuit 52a generates a phase-inverted signal whose phase is inverted to that of the noise in the conductive line 1a detected by the detection circuit 51, whereas the phase-inverted signal generation circuit 52b generates a phase-inverted signal whose phase is inverted to that of the noise in the conductive line 1b detected by the detection circuit 51. The phase-inverted signal generation circuits 52a and 52b each have the same configuration as that of the phase-inverted signal generation circuit 12 shown in FIG. 2, for example.

The injection circuit 53 causes a change in voltage in the conductive line 1a, the change corresponding to the phase-inverted signal generated by the phase-inverted signal generation circuit 52a, and thereby injects the phase-inverted signal generated by the circuit 52a into the conductive line 1a, thereby canceling the noise in the conductive line 1a. The injection circuit 53 also causes a change in voltage in the conductive line 1b, the change corresponding to the phase-inverted signal generated by the phase-inverted signal generation circuit 52b, and thereby injects the phase-inverted signal generated by the circuit 52b into the conductive line 1b, thereby canceling the noise in the conductive line 1b. Thus, the injection circuit 53 cancels the voltage-related normal mode noise in the electric power line 1.

FIG. 9 shows an example of a configuration of the injection circuit 53. In this example, the injection circuit 53 has a condenser 53a and a condenser 53b. An end of the condenser 53a is connected to an output of the phase-inverted signal generation circuit 52a, and the other end is connected to the conductive line 1a. An end of the condenser 53b is connected to an output of the phase-inverted signal generation circuit 52b, and the other end is connected to the conductive line 1b. In this example, the injection circuit 53 causes changes in voltage in the conductive lines 1a and 1b, the changes corresponding to the phase-inverted signals generated by the phase-inverted signal generation circuits 52a and 52b, respectively, via the condensers 53a and 53b, respectively.

In the power line noise filter 50 of this embodiment, the detection circuit 51 detects variations in voltage in each of the conductive lines 1a and 1b, to thereby detect noise occurring in each of the conductive lines 1a and 1b, separately for each of the conductive lines 1a and 1b. Voltage-related normal mode noise in the electric power line 1 is thereby detected. Then, the phase-inverted signal generation circuits 52a and 52b generate phase-inverted signals whose phases are inverted to those of the noises in the conductive lines 1a and 1b, respectively, detected by the detection circuit 51. Further, the injection circuit 53 causes changes in voltage in the conductive lines 1a and 1b, respectively, the changes corresponding to the respective phase-inverted signals. The voltage-related normal mode noise in the electric power line 1 is thereby canceled. In addition, according to the embodiment, voltage-related common mode noise in the electric power line 1 is also canceled, because noises in the conductive lines 1a and 1b are detected and canceled separately for each of the two conductive lines.

According to the power line noise filter 50 of this embodiment, noises in the electric power line 1 are detected by detecting variations in voltage in the electric power line 1, and the noises in the electric power line 1 are canceled by causing changes in voltage in the electric power line 1 corresponding to the phase-inverted signals. Therefore, the noise filter 50 neither amplifies the voltage of noise nor converts the voltage of noise into a current of inverted phase. Delay of the phase-inverted signal against noise, and difference in waveform of the phase-inverted signal from the waveform of the noise can therefore be minimized. Accordingly, the power line noise filter 50 is capable of canceling noise with high accuracy.

Other configurations, functions and effects of the fifth embodiment are the same as those of the first embodiment. Moreover, the examples of use of the power line noise filter 10 shown in the first embodiment are also applicable to the power line noise filter 50 of the fifth embodiment.

[Sixth Embodiment]

Figure 10:
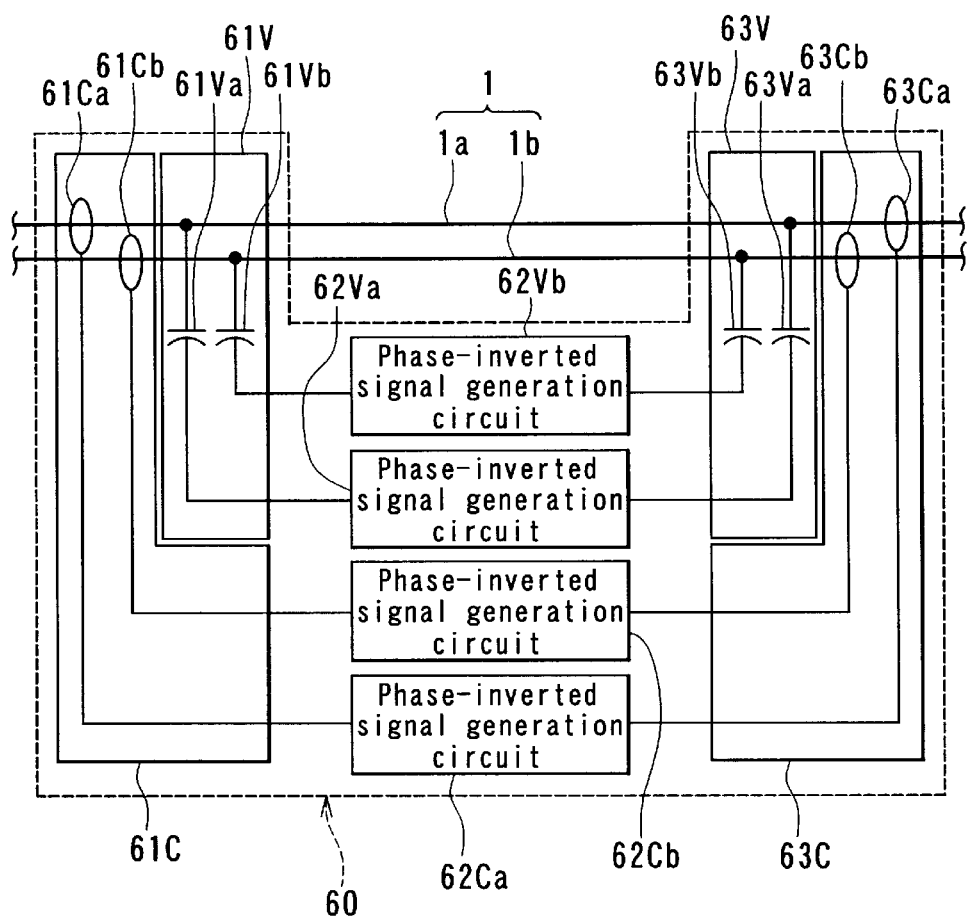
FIG. 10 is a block diagram showing a configuration of a power line noise filter according to a sixth embodiment of the invention.

FIG. 10 is a block diagram showing a configuration of a power line noise filter according to a sixth embodiment of the invention. The power line noise filter 60 of this embodiment reduces current-related normal mode noise, voltage-related normal mode noise, current-related common mode noise and voltage-related common mode noise in the electric power line 1.

The power line noise filter 60 comprises: a detection circuit 61C for detecting current-related noise in each of the two conductive lines 1a and 1b of the electric power line 1; a detection circuit 61V for detecting voltage-related noise in each of the two conductive lines 1a and 1b of the electric power line 1; two phase-inverted signal generation circuits 62Ca and 62Cb for generating phase-inverted signals whose phases are inverted to those of the noises detected by the detection circuit 61C for the lines 1a and 1b, respectively; two phase-inverted signal generation circuits 62Va and 62Vb for generating phase-inverted signals whose phases are inverted to those of the noises detected by the detection circuit 61V for the lines 1a and 1b, respectively; an injection circuit 63C for injecting the phase-inverted signals generated by the phase-inverted signal generation circuits 62Ca and 62Cb into the conductive lines 1a and 1b, respectively; and an injection circuit 63V for injecting the phase-inverted signals generated by the phase-inverted signal generation circuits 62Va and 62Vb into the conductive lines 1a and 1b, respectively. The detection circuits 61C and 61V are placed closer to a noise source than the injection circuits 63C and 63V.

The detection circuit 61C corresponds to the first noise detection means or the first noise detection circuit of the invention. The phase-inverted signal generation circuits 62Ca and 62Cb correspond to the first phase-inverted signal generation means or the first phase-inverted signal generation circuit of the invention. The injection circuit 63C corresponds to the first noise cancellation means or the first noise cancellation circuit of the invention. The detection circuit 61V corresponds to the second noise detection means or the second noise detection circuit of the invention. The phase-inverted signal generation circuits 62Va and 62Vb correspond to the second phase-inverted signal generation means or the second phase-inverted signal generation circuit of the invention. The injection circuit 63V corresponds to the second noise cancellation means or the second noise cancellation circuit of the invention.

The detection circuit 61C detects current-related noise occurring in each of the conductive lines 1a and 1b of the electric power line 1, separately for each of the conductive lines 1a and 1b, by detecting variations in electric current in these conductive lines. Thus, the detection circuit 61C detects current-related normal mode noise in the electric power line 1. The noise detected by the detection circuit 61C corresponds to the first noise of the invention.

The detection circuit 61V detects voltage-related noise occurring in each of the conductive lines 1a and 1b, separately for each of the conductive lines 1a and 1b, by detecting variations in voltage in these conductive lines. Thus, the detection circuit 61V detects voltage-related normal mode noise in the electric power line 1. The noise detected by the detection circuit 61V corresponds to the second noise of the invention.

FIG. 10 shows an example of configurations of the detection circuits 61C and 61V. In this example, the detection circuit 61C has: a core that surrounds the conductive line 1a and a coil 61Ca wound around the core; and, a core that surrounds the conductive line 1b and a coil 61Cb wound around the core. An end of the coil 61Ca is connected to an input of the phase-inverted signal generation circuit 62Ca, and the other end is connected to the ground of the circuit. An end of the coil 61Cb is connected to an input of the phase-inverted signal generation circuit 62Cb, and the other end is connected to the ground of the circuit. The detection circuit 61C detects high frequency components among variations in electric current in the conductive line 1a by means of an electric current induced in the coil 61Ca, and also detects high frequency components among variations in electric current in the conductive line 1b by means of an electric current induced in the coil 61Cb.

In this example, the detection circuit 61V has a condenser 61Va and a condenser 61Vb. An end of the condenser 61Va is connected to the conductive line 1a, and the other end is connected to an input of the phase-inverted signal generation circuit 62Va. An end of the condenser 61Vb is connected to the conductive line 1b, and the other end is connected to an input of the phase-inverted signal generation circuit 62Vb. The condensers 61Va and 61Vb allow high frequency components to pass, among variations in voltage of the conductive lines 1a and 1b, respectively, while blocking low frequency components including frequencies of alternating currents.

The phase-inverted signal generation circuit 62Ca generates a phase-inverted signal whose phase is inverted to that of the current-related noise in the conductive line 1a detected by the detection circuit 61C. The phase-inverted signal generation circuit 62Cb generates a phase-inverted signal whose phase is inverted to that of the current-related noise in the conductive line 1b detected by the detection circuit 61C. The phase-inverted signal generation circuit 62Va generates a phase-inverted signal whose phase is inverted to that of the voltage-related noise in the conductive line 1a detected by the detection circuit 61V. The phase-inverted signal generation circuit 62Vb generates a phase-inverted signal whose phase is inverted to that of the voltage-related noise in the conductive line 1b detected by the detection circuit 61V. The phase-inverted signals generated by the phase-inverted signal generation circuits 62Ca and 62Cb correspond to the first phase-inverted signal of the invention. The phase-inverted signals generated by the phase-inverted signal generation circuits 62Va and 62Vb correspond to the second phase-inverted signal of the invention. The phase-inverted signal generation circuits 62Ca, 62Cb, 62Va and 62Vb each have the same configuration as that of the phase-inverted signal generation circuit 12 shown in FIG. 2, for example.

The injection circuit 63C causes changes in electric current in the conductive lines 1a and 1b, the changes corresponding to the phase-inverted signals generated by the phase-inverted signal generation circuits 62Ca and 62Cb, respectively, and thereby injects the phase-inverted signals generated by the circuits 62Ca and 62Cb into the conductive lines 1a and 1b, respectively, thereby canceling the current-related noises in the conductive lines 1a and 1b. Thus, the injection circuit 63C cancels the current-related normal mode noise in the electric power line 1.

The injection circuit 63V causes changes in voltage in the conductive lines 1a and 1b, the changes corresponding to the phase-inverted signals generated by the phase-inverted signal generation circuits 62Va and 62Vb, respectively, and thereby injects the phase-inverted signals generated by the circuits 62Va and 62Vb into the conductive lines 1a and 1b, respectively, thereby canceling the voltage-related noises in the conductive lines 1a and 1b. Thus, the injection circuit 63V cancels the voltage-related normal mode noise in the electric power line 1.

FIG. 10 shows an example of configurations of the injection circuits 63C and 63V. In this example, the injection circuit 63C has: a core that surrounds the conductive line 1a and a coil 63Ca wound around the core; and a core that surrounds the conductive line 1b and a coil 63Cb wound around the core. An end of the coil 63Ca is connected to an output of the phase-inverted signal generation circuit 62Ca, and the other end is connected to the ground of the circuit. An end of the coil 63Cb is connected to an output of the phase-inverted signal generation circuit 62Cb, and the other end is connected to the ground of the circuit. In this example, by feeding electric currents to the coils 63Ca and 63Cb, the injection circuit 63C causes changes in electric current in the conductive lines 1a and 1b respectively, the changes corresponding to the phase-inverted signals generated by the phase-inverted signal generation circuits 62Ca and 62Cb, respectively.

In this example the injection circuit 63V has a condenser 63Va and a condenser 63Vb. An end of the condenser 63Va is connected to an output of the phase-inverted signal generation circuit 62Va, and the other end is connected to the conductive line 1a. An end of the condenser 63Vb is connected to an output of the phase-inverted signal generation circuit 62Vb, and the other end is connected to the conductive line 1b. In this example, the injection circuit 63V causes changes in voltage in the conductive lines 1a and 1b respectively, the changes corresponding to the phase-inverted signals generated by the phase-inverted signal generation circuits 62Va and 62Vb, respectively, via the condensers 63Va and 63Vb, respectively.

In the power line noise filter 60 of this embodiment, the detection circuit 61C detects variations in electric current in each of the conductive lines 1a and 1b, to thereby detect current-related noise occurring in each of the conductive lines 1a and 1b, separately for each of the conductive lines 1a and 1b. Current-related normal mode noise in the electric power line 1 is thereby detected. On the other hand, the detection circuit 61V detects variations in voltage in each of the conductive lines 1a and 1b, to thereby detect voltage-related noise occurring in each of the conductive lines 1a and 1*b*, separately for each of the conductive lines 1*a* and 1*b*. Voltage-related normal mode noise in the electric power line 1 is thereby detected.

Then, the phase-inverted signal generation circuits 62Ca and 62Cb generate phase-inverted signals whose phases are inverted to those of the current-related noises in the conductive lines 1*a* and 1*b*, respectively, detected by the detection circuit 61C. On the other hand, the phase-inverted signal generation circuits 62Va and 62Vb generate phase-inverted signals whose phases are inverted to those of the voltage-related noises in the conductive lines 1*a* and 1*b*, respectively, detected by the detection circuit 61V.

Further, the injection circuit 63C causes changes in electric current, separately for the two conductive lines 1*a* and 1*b*, the changes corresponding to the phase-inverted signals generated by the phase-inverted signal generation circuits 62Ca and 62Cb, respectively. On the other hand, the injection circuit 63V causes changes in voltage, separately for the two conductive lines 1*a* and 1*b*, the changes corresponding to the phase-inverted signals generated by the phase-inverted signal generation circuits 62Va and 62Vb, respectively. The current-related normal mode noise and the voltage-related normal noise in the electric power line 1 are thereby canceled. In addition, according to the embodiment, current-related common mode noise and voltage-related common mode noise in the electric power line 1 are also canceled, because noises in the conductive lines 1*a* and 1*b* are detected and canceled separately for each of the two conductive lines.

According to the power line noise filter 60 of this embodiment, current-related noise in the electric power line 1 is detected by detecting variations in electric current in the electric power line 1, and the current-related noise in the electric power line 1 is canceled by causing a change in electric current in the electric power line 1, the change corresponding to the phase-inverted signal whose phase is inverted to that of the current-related noise. Further, according to the power line noise filter 60, voltage-related noise in the electric power line 1 is detected by detecting variations in voltage in the electric power line 1, and the voltage-related noise in the electric power line 1 is canceled by causing a change in voltage in the electric power line 1, the change corresponding to the phase-inverted signal whose phase is inverted to that of the voltage-related noise. Therefore, the noise filter 60 neither amplifies the voltage of noise nor converts the voltage of noise into a current of inverted phase. Delay of the phase-inverted signal against noise, and difference in waveform of the phase-inverted signal from the waveform of the noise can therefore be minimized. Accordingly, the power line noise filter 60 is capable of canceling noise with high accuracy.

Other configurations, functions and effects of the sixth embodiment are the same as those of the first embodiment. Moreover, the examples of use of the power line noise filter 10 shown in the first embodiment are also applicable to the power line noise filter 60 of the sixth embodiment.

[Seventh Embodiment]

Figure 11:
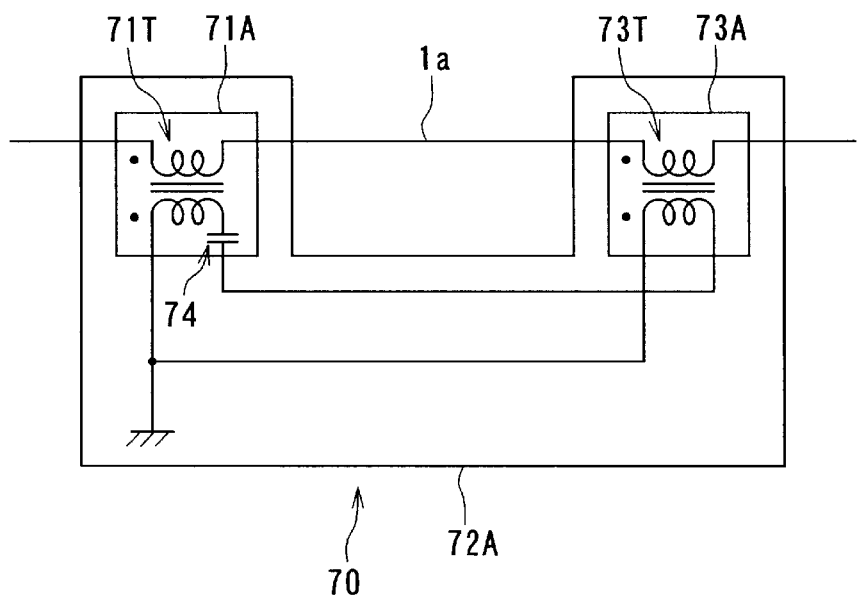
FIG. 11 is a block diagram showing a configuration of a power line noise filter according to a seventh embodiment of the invention.

FIG. 11 is a block diagram showing a configuration of a power line noise filter according to a seventh embodiment of the invention. The power line noise filter 70 of this embodiment reduces current-related normal mode noise and current-related common mode noise in the electric power line 1, like the fourth embodiment. In this embodiment, the detection circuit and the injection circuit each form a part of the phase-inverted signal generation circuit.

The power line noise filter 70 comprises: a detection circuit 71A for detecting noise in the conductive line 1*a* of the electric power line 1; an injection circuit 73A for injecting a phase-inverted signal, whose phase is inverted to that of the noise detected by the detection circuit 71A, into the conductive line 1*a*; and a phase-inverted signal generation circuit 72A that includes the detection circuit 71A and the injection circuit 73A. The detection circuit 71A is placed closer to a noise source than the injection circuit 73A. The detection circuit 71A corresponds to the noise detection means or the noise detection circuit of the invention. The phase-inverted signal generation circuit 72A corresponds to the phase-inverted signal generation means or the phase-inverted signal generation circuit of the invention. The injection circuit 73A corresponds to the noise cancellation means or the noise cancellation circuit of the invention.

The detection circuit 71A has: a transformer 71T including a primary winding and a secondary winding; and a condenser 74 an end of which is connected to an end of the secondary winding of the transformer 71T. In the transformer 71T, the primary winding is connected in serial with the conductive line 1*a*. On the other hand, the injection circuit 73A has: a transformer 73T including a primary winding and a secondary winding. In the transformer 73T, the primary winding is connected in serial with the conductive line 1*a*. The other end of the condenser 74 is connected to an end of the secondary winding of the transformer 73T. The other end of the secondary winding of the transformer 71T and the other end of the secondary winding of the transformer 73T are grounded. Here, the secondary winding of the transformer 71T and the secondary winding of the transformer 73T are connected in such a way that a change in electric current in the primary winding of the transformer 73T has a phase inverted to that of a change in electric current in the primary winding of the transformer 71T.

In the detection circuit 71A, variation in electric current in the primary winding of the transformer 71T connected to the conductive line 1*a* induces an electric current in the secondary winding of the transformer 71T. Of the electric current induced in the secondary winding of the transformer 71T, high frequency components, that is, noise components, are outputted by the detection circuit 71A after passing through the condenser 74. Thus, the detection circuit 71A detects noise in the conductive line 1*a*.

The electric current outputted by the detection circuit 71A flows through the secondary winding of the transformer 73T of the injection circuit 73A, and as a result, an electric current is induced in the primary winding of the transformer 73T. The electric current induced in the primary winding of the transformer 73T has a phase inverted to that of the noise detected by the detection circuit 71A. Thus, the injection circuit 73A cancels the current-related normal mode noise in the conductive line 1*a*.

In the power line noise filter 70 of this embodiment, a detection circuit, an injection circuit and a phase-inverted signal generation circuit are provided for the conductive line 1*b* of the electric power line 1, whose configurations are identical to those of the detection circuit 71A, the injection circuit 73A and the phase-inverted signal generation circuit 72A, respectively, provided for the conductive line 1*a*.

In this embodiment, the detection circuit 71A and the injection circuit 73A each form a part of the phase-inverted signal generation circuit 72A, which simplifies the configuration of the power line noise filter 70.

Other configurations, functions and effects of the seventh embodiment are the same as those of the fourth embodiment. Moreover, the examples of use of the power line noise filter 10 shown in the first embodiment are also applicable to the power line noise filter 70 of the seventh embodiment.

[Eighth Embodiment]

Figure 12:
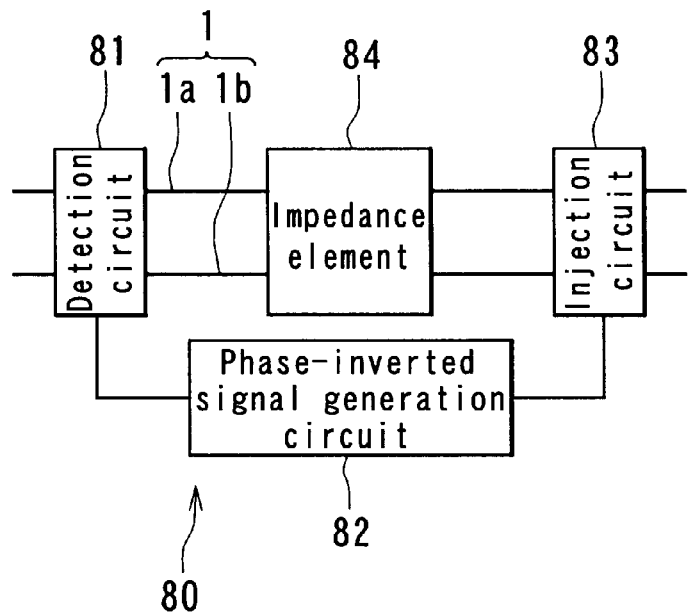
FIG. 12 is a block diagram showing a basic configuration of a power line noise filter according to an eighth embodiment of the invention.

Next, a power line noise filter according to an eighth embodiment of the invention will be described. FIG. 12 is a block diagram showing a basic configuration of the power line noise filter of this embodiment. The power line noise filter 80 of this embodiment comprises: a detection circuit 81 that is provided at a specific position on the electric power line 1 and detects noise in the electric power line 1; a phase-inverted signal generation circuit 82 that generates a phase-inverted signal whose phase is inverted to that of the noise detected by the detection circuit 81; an injection circuit 83 that is provided at a position on the electric power line 1 different from that of the detection circuit 81, and injects the phase-inverted signal generated by the phase-inverted signal generation circuit 82 into the electric power line 1; and an impedance element 84 that is provided between the detection circuit 81 and the injection circuit 83 on the electric power line 1, and has an impedance that reduces the peak value of a noise passing therethrough. The detection circuit 81 is placed closer to the noise source than the injection circuit 83. The detection circuit 81 corresponds to the noise detection means or the noise detection circuit of the invention. The phase-inverted signal generation circuit 82 corresponds to the phase-inverted signal generation means or the phase-inverted signal generation circuit of the invention. The injection circuit 83 corresponds to the noise cancellation means or the noise cancellation circuit of the invention. The impedance element 84 corresponds to the peak-value-reducing impedance component of the invention.

In the power line noise filter 80 shown in FIG. 12, parts other than the impedance element 84 may be configured as in any of the first through seventh embodiments.

At a frequency of electricity to be conveyed by the electric power line 1, the impedance element 84 has an impedance sufficiently small so as not to interfere with the electricity being conveyed, whereas, in the frequency band of noise, the impedance element 84 has a large impedance so as to reduce the peak value of the noise. An inductor may be used, for example, as the impedance element 84.

Next, functions of the power line noise filter 80 shown in FIG. 12 will be described. In the noise filter 80, the impedance element 84 is provided along the electric power line 1 between the detection circuit 81 and the injection circuit 83. Therefore, if noise has occurred in part of the electric power line 1 on the side of the detection circuit 81 relative to the impedance element 84 (the part of the power line 1 is hereinafter simply referred to as "the detection-circuit-81-side power line 1"), and the noise passes through the impedance element 84 to enter into another part of the electric power line 1 on the side of the injection circuit 83 relative to the impedance element 84 (the part of the power line 1 is hereinafter simply referred to as "the injection-circuit-83-side power line 1"), the peak value of the noise in the injection-circuit-83-side power line 1 becomes lower than that of the noise in the detection-circuit-81-side power line 1. Further, in this embodiment, the impedance element 84 allows the peak value of noise in detection-circuit-81-side power line 1 and that in the injection-circuit-83-side power line 1 to remain different from each other.

In the power line noise filter 80 shown in FIG. 12, the detection circuit 81 detects noise in the electric power line 1. Then, the phase-inverted signal generation circuit 82 generates a phase-inverted signal whose phase is inverted to that of the noise detected by the detection circuit 81. Further, the injection circuit 83 injects the phase-inverted signal generated by the phase-inverted signal generation circuit 82 into the electric power line 1. Thus, noise in the injection-circuit-83-side power line 1 is canceled.

In this embodiment, the peak value of noise after passing through the impedance element 84 is lower than the peak value of the noise before passing through the impedance element 84. Therefore, in the embodiment, the peak value of a phase-inverted signal injected into the electric power line 1 by the injection circuit 83 needs to be adjusted to make it closer to the peak value of the noise inputted to the injection circuit 83 after passing through the impedance element 84.

As described above, in this embodiment, the peak value of noise in the injection-circuit-83-side power line 1 is reduced by allowing the noise reduction effect of the impedance element 84 and the noise reduction effect of injection of phase-inverted signals to work in synergy. Further, according to the embodiment, since the peak value of noise in the detection-circuit-81-side power line 1 and that in the injection-circuit-83-side power line 1 can be kept different from each other, it is possible to keep the peak value of the noise in the injection-circuit-83-side power line 1 stable and low. Thus, according to this embodiment, it is possible to effectively reduce noise in the injection-circuit-83-side power line 1.

Here, it would be ideal if the phase difference were 180° between the noise inputted to the injection circuit 83 and the change in electric current or voltage in the electric power line 1 caused by the injection circuit 83, that is, the phase-inverted signal injected into the electric power line 1 by the injection circuit 83. However, in this embodiment, the phase of noise may change before and after passing through the impedance element 84, because the impedance element 84 is provided between the detection circuit 81 and the injection circuit 83 on the electric power line 1. For this reason, in the power line noise filter 80 shown in FIG. 12, the phase difference may deviate greatly from 180° between the noise inputted to the injection circuit 83 and the phase-inverted signal injected into the electric power line 1 by the injection circuit 83. In this case, an impedance element having an impedance that adjusts the phase of the phase-inverted signal is preferably provided along the signal path that starts from the detection circuit 81 to reach the injection circuit 83 via the phase-inverted signal generation circuit 82.

Figure 13:
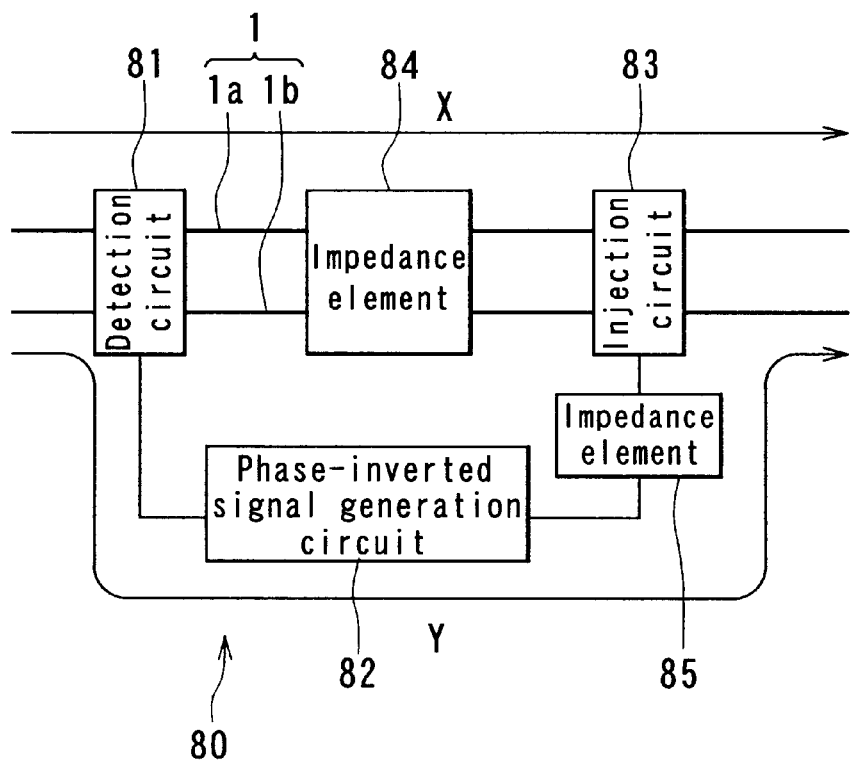
FIG. 13 is a block diagram showing an example of a configuration of the power line noise filter according to the eighth embodiment of the invention.

FIG. 13 is a block diagram showing a configuration of the power line noise filter 80 with an impedance element for phase adjustment provided along the signal path starting from the detection circuit 81 to reach the injection circuit 83 via the phase-inverted signal generation circuit 82. In this noise filter 80, an impedance element 85 is inserted between the phase-inverted signal generation circuit 82 and the injection circuit 83. The impedance element 85 adjusts the phase of the phase-inverted signal so that the phase difference would be closer to 180° between the noise inputted to the injection circuit 83 and the phase-inverted signal injected into the electric power line 1 by the injection circuit 83. Further, the impedance element 85 can also adjust the peak value of the phase-inverted signal injected into the electric power line 1 by the injection circuit 83 so that it would be closer to the peak value of the noise inputted to the injection circuit 83. The impedance element 85 corresponds to the phase-adjusting impedance component of the invention.

Here, as shown in FIG. 13, the path of the signal passing through the detection circuit 81, the impedance element 84 and the injection circuit 83 is referred to as Path X, whereas the path of the signal passing through the detection circuit 81, the phase-inverted signal generation circuit 82, the impedance element 85 and the injection circuit 83 is referred to as Path Y. Impedance of the impedance element 85 is set so as to make the phase difference closer to 180° between the signal that has passed through Path X and the signal that has passed through Path Y. Here, the impedance element 85 may be eliminated, and instead the phase-inverted signal generation circuit 82 may have a function of making the phase difference closer to 180° between the signal that has passed through Path X and the signal that has passed through Path Y.

According to the power line noise filter 80 shown in FIG. 13, the phase difference can be made closer to 180° between the noise inputted to the injection circuit 83 and the phase-inverted signal injected into the electric power line 1 by the injection circuit 83, and, the peak value of the phase-inverted signal injected into the electric power line 1 by the injection circuit 83 can be made closer to the peak value of the noise inputted to the injection circuit 83. Therefore, the power line noise filter 80 can reduce noise in the injection-circuit-83-side power line 1 more effectively. Other functions and effects of the noise filter 80 shown in FIG. 13 are the same as those of the noise filter 80 shown in FIG. 12.

Figure 14:
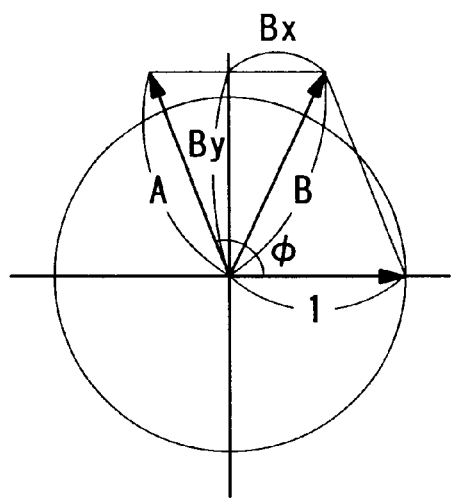
FIG. 14 is a vector diagram showing vectors that represent noise, a phase-inverted signal and a synthetic signal that is obtained by synthesizing the first two, of the eighth embodiment of the invention.

Next, with reference to FIG. 14, explanation will be given as to a preferable relationship between the phase and peak value of noise inputted to the injection circuit 83 and the phase and peak value of the phase-inverted signal injected into the electric power line 1 by the injection circuit. FIG. 14 is a vector diagram showing vectors that represent the noise inputted to the injection circuit 83, the phase-inverted signal injected into the electric power line 1 by the injection circuit 83, and a synthesized signal obtained by synthesizing the first two. As shown in FIG. 14, the size of the vector of the noise inputted to the injection circuit 83 is assumed to be 1, the size of the vector of the phase-inverted signal injected into the electric power line 1 by the injection circuit 83 is assumed to be A (A≧0), and the phase difference between the vector of the phase-inverted signal and the vector of the noise is assumed to be $\phi$ (0°≦$\phi$≦360°). The size of the vector of the synthesized signal obtained by synthesizing the noise and the phase-inverted signal is assumed to be B. Here, the vector of the synthesized signal is separated into a component having the same phase as that of the vector of the noise and a component having a phase different from that of the vector of the noise by 90°, and the sizes of those components are assumed to be $B_x$ and $B_y$, respectively. B, $B_x$ and $B_y$ are represented by the following equations:

$B_x = 1 + A \cos \phi$ $B_y = A \sin \phi$ $$B^2 = B_x^2 + B_y^2 = (1 + A \cos \phi)^2 + A^2 \sin^2 \phi = 1 + 2A \cos \phi + A^2 \quad (1)$$

From Equation (1), $B^2$ takes the minimum value $(1-A)^2$ when $\phi=180°$. When A=1, the minimum value is 0. Therefore, the optimum conditions for noise reduction would be $\phi=180°$ and A=1. In other words, the optimum conditions for noise reduction would be that the phase difference between the noise and the phase-inverted signal is 180°, and the peak value of the noise equals the peak value of the phase-inverted signal.

Next, the condition for reducing noise, or to make B<1, is sought. The condition to make B<1 is obtained as follows, from Equation (1).

$$2A \cos \phi + A^2 < 0 \quad (2)$$

From Equation (2), it is necessary that A≠0, or $$A < 0 \quad (3).$$

When A≠0, Equation (2) would be as follows.

$2 \cos \phi + A < 0$ $$\cos \phi < -A/2 \quad (4)$$

Assuming that A=1, Equation (4) would be as follows.

$\cos \phi < -1/2$

Therefore, to make B<1 when A=1, it is necessary that

120°<$\phi$<240°.

On the other hand, assuming that $\phi=180°$, Equation (4) would be as follows:

$-1 < -A/2$ $$A < 2 \quad (5)$$

Therefore, from Equations (3) and (5), the following condition needs to be met in order to make B<1 when $\phi=180°$.

0<A<2

Next, as an example, the conditions to make B≦1/5 are sought. The conditions to make B≦1/5 would be as follows, from Equation (1).

$1 + 2A \cos \phi + A^2 \leq 1/25$ $$2A \cos \phi + A^2 \leq -24/25 \quad (6)$$

Assuming A=1, Equation (6) would be as follows:

$\cos \phi \leq -49/50$

Therefore, to make B≦1/5 when A=1, it would be necessary that

169°≦$\phi$≦191°.

On the other hand, assuming $\phi=180°$, Equation (6) would be as follows:

$-2A + A^2 \leq -24/25$ $A^2 - 2A + 24/25 \leq 0$ $(A-4/5)(A-6/5) \leq 0$ $4/5 \leq A \leq 6/5$ Therefore, to make B≦1/5 when $\phi=180°$, it would be necessary that 0.8≦A≦1.2.

Figure 15:
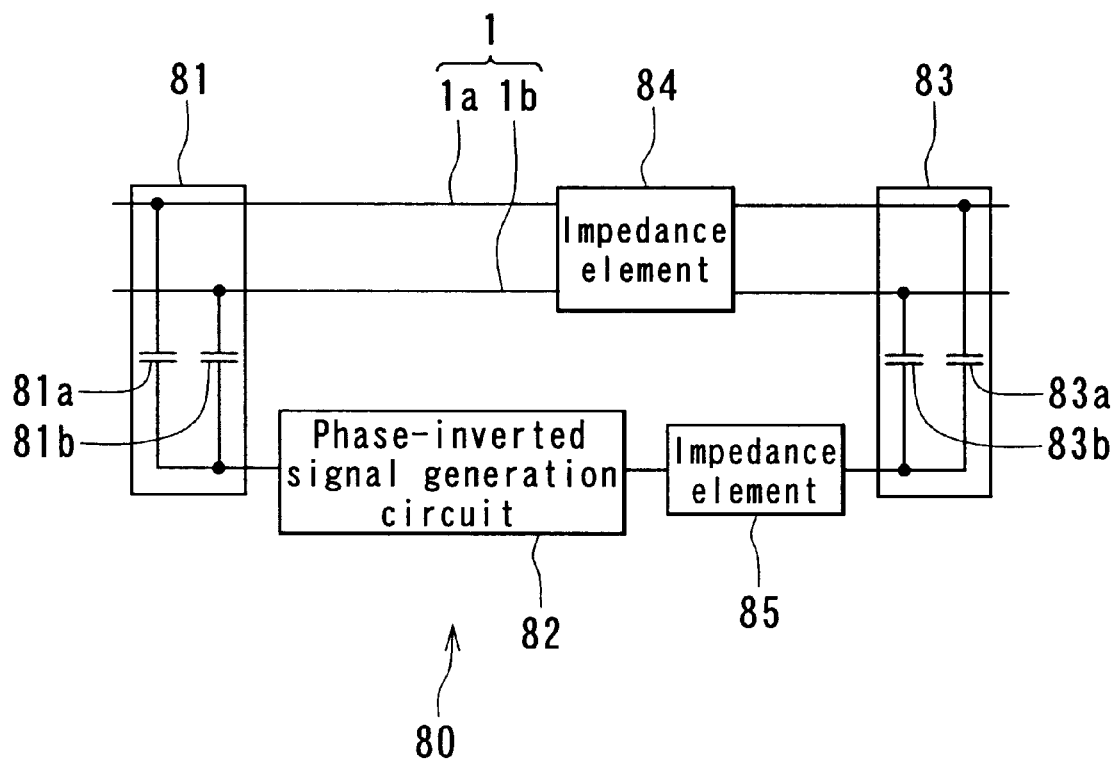
FIG. 15 is a block diagram showing a configuration of a power line noise filter of an example of the eighth embodiment of the invention.
Figure 16:
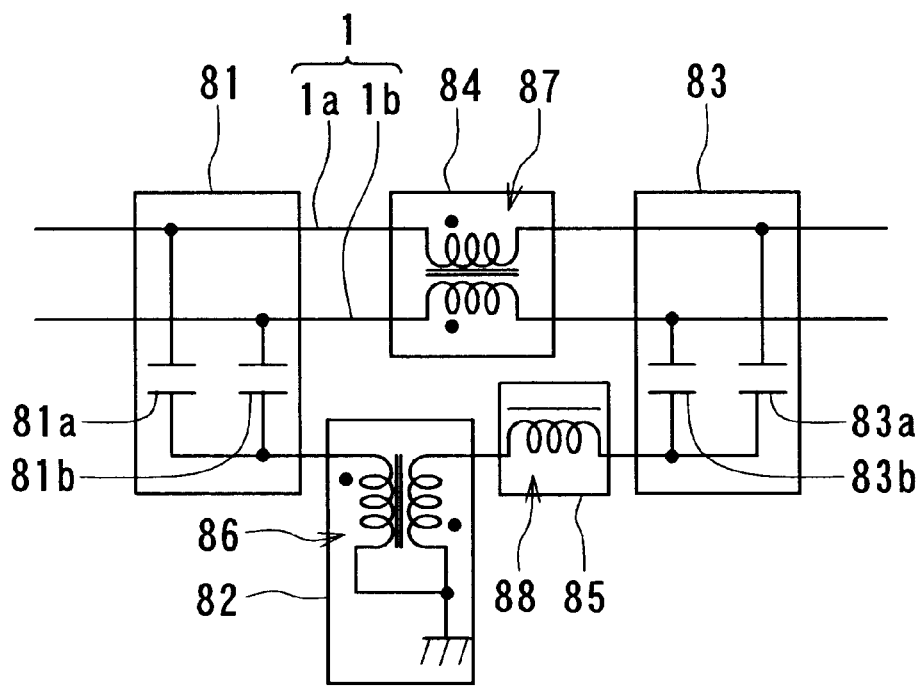
FIG. 16 is a circuit diagram showing a configuration of the power line noise filter of the example of the eighth embodiment of the invention.

Next, an example of the power line noise filter 80 of the embodiment shown in FIG. 13 will be described with reference to FIG. 15 and FIG. 16. FIG. 15 is a block diagram showing a configuration of the power line noise filter 80 of the example. FIG. 16 is a circuit diagram showing a configuration of the power line noise filter 80 of the example.

The power line noise filter 80 of this example reduces voltage-related common mode noise in the electric power line 1, like the second embodiment. As shown in FIG. 15, in this power line noise filter 80 a detection circuit 81 has a condenser 81a and a condenser 81b. An end of the condenser 81a is connected to the conductive line 1a, and the other end is connected to an input of a phase-inverted signal generation circuit 82. An end of the condenser 81b is connected to the conductive line 1b, and the other end is connected to the input of the phase-inverted signal generation circuit 82. The condensers 81a and 81b allow high frequency components to pass, among variations in voltage of the conductive lines 1a and 1b, respectively, while blocking low frequency components including a frequency of alternating current of electric power. Further, in the power line noise filter 80, an injection circuit 83 has a condenser 83a and a condenser 83b. An end of the condenser 83a is connected to an output of the phase-inverted signal generation circuit 82, and the other end is connected to the conductive line 1a. An end of the condenser 83b is connected to the output of the phase-inverted signal generation circuit 82, and the other end is connected to the conductive line 1b. In this example, the injection circuit 83 causes the same changes in voltage in the conductive lines 1a and 1b corresponding to the phase-inverted signal, via the condensers 83a and 83b.

In the power line noise filter 80 of this example, the phase-inverted signal generation circuit 82 has a transformer 86, as shown in FIG. 16. An end of the primary winding of the transformer 86 is connected to the condensers 81a and 81b. The other end of the primary winding of the transformer 86 is connected to the ground (signal ground) of the circuit, along with an end of the secondary winding of the transformer 86. The other end of the secondary winding of the transformer 86 is connected to an impedance element 85.

Further, in the power line noise filter 80 of this example, a common mode choke coil 87 is used for the impedance element 84, and a line choke coil 88 is used for the impedance element 85.

In the power line noise filter 80 of this example, capacitance of each of the condensers 81a and 81b is set so as to regulate leakage currents within specific standards. Specifically, the capacitance of each of the condensers 81a, 81b, 83a and 83b is, for example, within a range of 10 to 20,000 pF.

Further, it is ideal if the ratio between the number of turns of the primary winding and that of the secondary winding were 1:1, but the ratio may vary, considering attenuation of signals by the transformer 86.

Next, an example of characteristics of the power line noise filter 80 of this example will be described. In this example, the power line noise filter 80 was prepared according to the following conditions. Specifically, the capacitance of each of the condensers 81a, 81b, 83a and 83b was 1,000 pF. The ratio between the number of turns of the primary winding and that of the secondary winding of the transformer 86 was 1:1. The inductance on the primary winding side of the transformer 86 was 0.1 $\mu$H. The impedance of the impedance element 84 (the common mode choke coil 87) was 10 $\mu$H. The impedance of the impedance element 85 (the line choke coil 88) was 10 $\mu$H.

Figure 17:
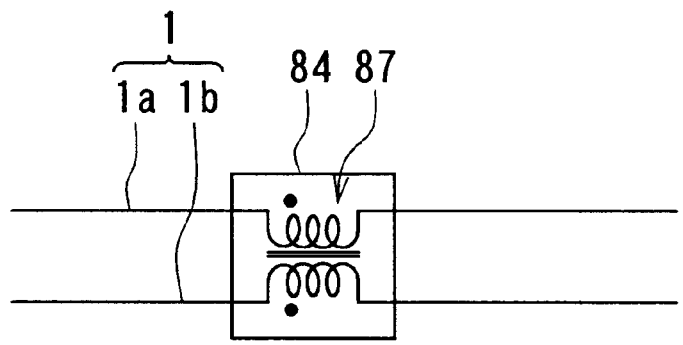
FIG. 17 is a circuit diagram showing a circuit of a first comparative example against the example of the eighth embodiment of the invention.
Figure 18:
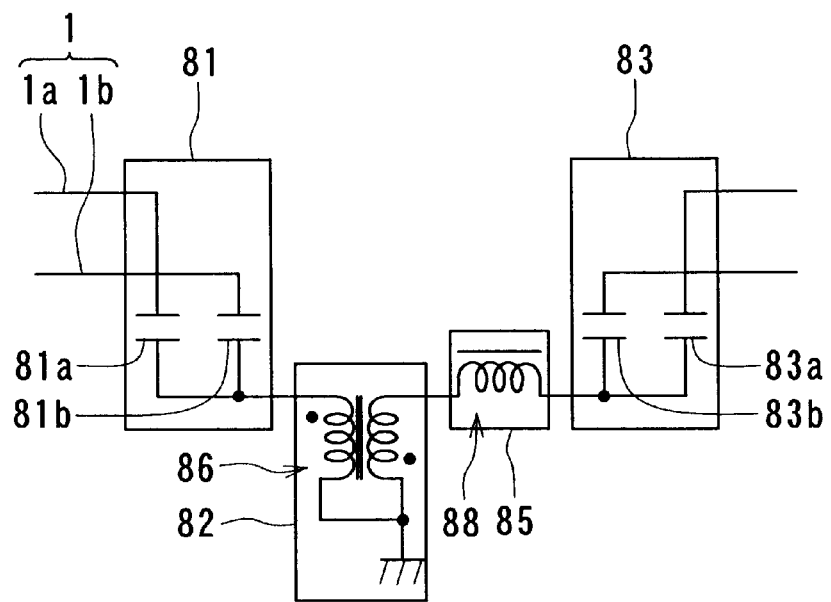
FIG. 18 is a circuit diagram showing a circuit of a second comparative example against the example of the eighth embodiment of the invention.

Two circuits of comparative example were prepared for comparison in characteristics with the noise filter 80 of the example of the embodiment. The circuit of a first comparative example does not have a phase-inverted signal path, but has a noise path only, whereas the circuit shown in FIG. 16 has both a noise path and a phase-inverted signal path. Specifically, as shown in FIG. 17, the circuit of the first comparative example is a circuit having only the impedance element 84 (the common mode choke coil 87) of the noise filter 80 of the example of the embodiment inserted onto the electric power line 1. The circuit of a second comparative example does not have a noise path, but has a phase-inverted signal path only, whereas the circuit shown in FIG. 16 has both a noise path and a phase-inverted signal path. Specifically, as shown in FIG. 18, the circuit of the second comparative example was formed by eliminating a part of the electric power line 1 to connect the detection circuit 81 to the injection circuit 83, and the impedance element 84, from the circuit shown in FIG. 16.

Figure 19:
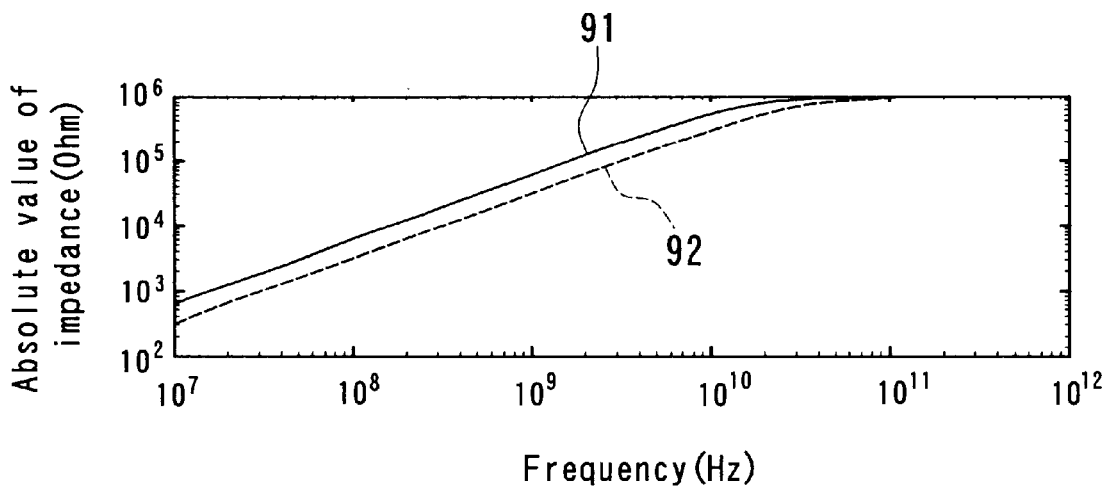
FIG. 19 is a characteristic diagram showing frequency characteristic of the absolute value of impedance of each of the power line noise filter of the example of the eighth embodiment and the circuits of the first and second comparative examples.

FIG. 19 shows the frequency characteristic of the absolute value of impedance of each of the power line noise filter 80 of the example of the embodiment and the circuits of the first and second comparative examples. In FIG. 19, the line indicated as 91 represents the characteristics of the circuits of the first and second comparative examples, and the line indicated as 92 represents the characteristic of the power line noise filter 80 of the example of the embodiment.

Figure 20:
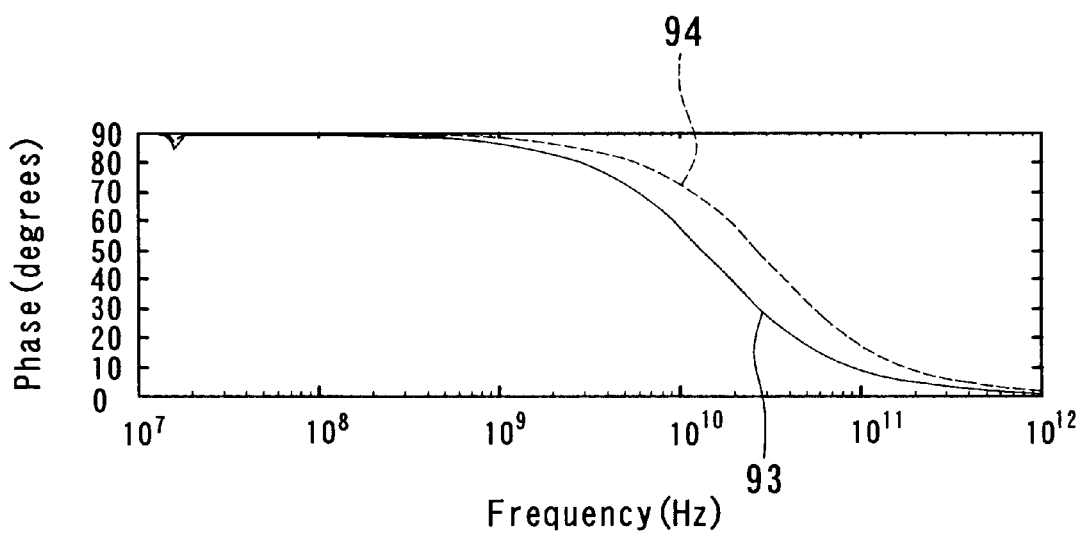
FIG. 20 is a characteristic diagram showing frequency characteristic of the initial phase of impedance of each of the power line noise filter of the example of the eighth embodiment and the circuits of the first and second comparative examples.

FIG. 20 shows the frequency characteristic at the initial phase of impedance of each of the power line noise filter 80 of the example of the embodiment and the circuits of the first and second comparative examples. In FIG. 20, the line indicated as 93 represents the characteristics of the circuits of the first and second comparative examples, and the line indicated as 94 represents the characteristic of the power line noise filter 80 of the example of the embodiment.

Figure 21:
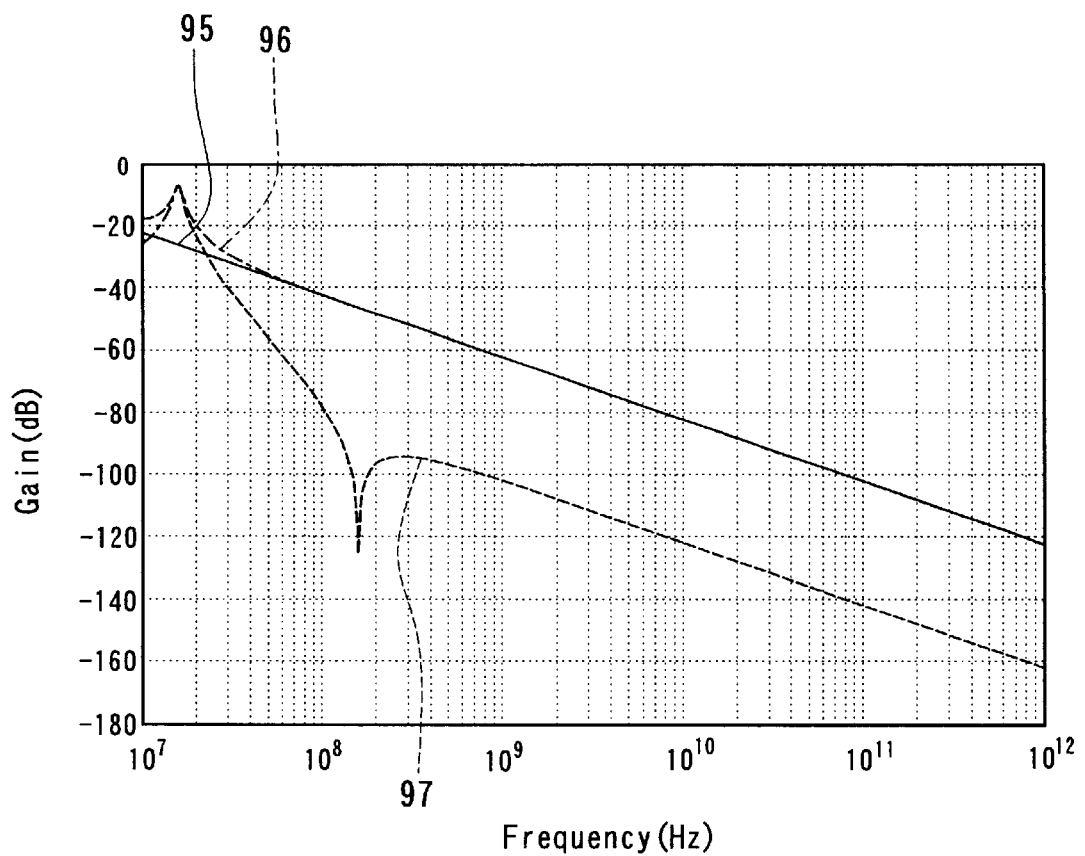
FIG. 21 is a characteristic diagram showing frequency characteristic of the gain of each of the power line noise filter of the example of the eighth embodiment and the circuits of the first and second comparative examples.

FIG. 21 shows the frequency characteristic of the gain for each of the power line noise filter 80 of the example of the embodiment and the circuits of the first and second comparative examples. In FIG. 21, the line indicated as 95 represents the characteristic of the circuit of the first comparative example, the line indicated as 96 represents the characteristic of the circuit of the second comparative example, and the line indicated as 97 represents the characteristic of the power line noise filter 80 of the example of the embodiment. From FIG. 21, it is seen that the power line noise filter 80 of the example of the embodiment can reduce noise significantly, as compared with the circuit of the first comparative example having only the impedance element 84 (the common mode choke coil 87) inserted onto the electric power line 1.

Next, as a third comparative example, a circuit was formed by eliminating the impedance element 85 (the line choke coil 88) from the circuit shown in FIG. 16. The third comparative example is an example in which no adjustment is performed for phases of the phase-inverted signals.

Figure 22:
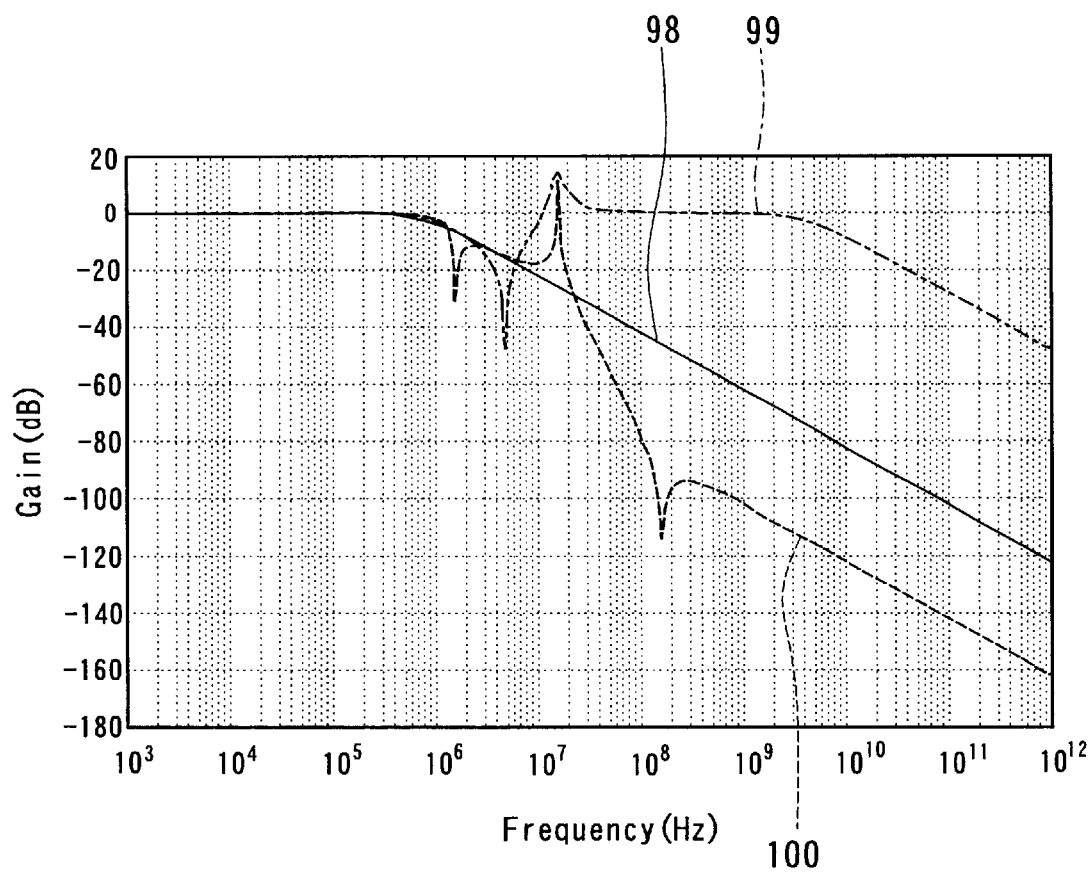
FIG. 22 is a characteristic diagram showing frequency characteristic of the gain of each of the power line noise filter of the example of the eighth embodiment, the circuit of the first comparative example and a circuit of a third comparative examples.

FIG. 22 shows the frequency characteristic of the gain for each of the power line noise filter 80 of the example of the embodiment and the circuits of the first and third comparative examples. In FIG. 22, the line indicated as 98 represents the characteristic of the circuit of the first comparative example, the line indicated as 99 represents the characteristic of the circuit of the third comparative example, and the line indicated as 100 represents the characteristic of the power line noise filter 80 of the example of the embodiment. As shown in FIG. 22, the circuit of the third comparative example, in which no adjustment is made for phases of the phase-inverted signals, has a noise reduction rate that is lower than that of the circuit of the first comparative example having only the impedance element 84 (the common mode choke coil 87) inserted onto the electric power line 1. On the contrary, the power line noise filter 80 of the example of the embodiment, in which adjustment of phases of the phase-inverted signals is performed, can reduce noise effectively.

In the embodiment of the invention, the impedance elements 84 and 85 need not be limited to inductors, but may be circuits having inductors, capacitors, and the like.

Other configurations, functions and effects of the present embodiment are the same as those of any of the first to seventh embodiments. Moreover, the examples of use of the power line noise filter 10 shown in the first embodiment are also applicable to the power line noise filter 80 of the eighth embodiment.

The invention is not limited to the embodiments described above, but may be modified in many ways. For example, the detected noise or the phase-inverted signal may be amplified as appropriate. Even in such a case, voltage of the noise is not converted into an electric current of inverted phase, and therefore it is possible to minimize a delay of the phase-inverted signal against noise, or difference in waveform of the phase-inverted signal from the waveform of noise.

As described above, the first power line noise filter of the invention detects noise in an electric power line by detecting variations in electric current in the electric power line; then generates a phase-inverted signal whose phase is inverted to that of the detected noise; and cancels the noise in the electric power line by causing a change in electric current in the electric power line corresponding to the phase-inverted signal. Therefore, according to the invention, it is possible to effectively reduce noise in an electric power line over a wide frequency band, and is also possible to effectively reduce sporadic noise as well as continuous noise.

Further, the first power line noise filter of the invention detects noises propagating through two conductive lines of an electric power line in the same phase, then, causes the same changes in electric current for the two conductive lines of the electric power line. Therefore, according to the invention, it is possible to effectively reduce common mode noise in an electric power line, in particular.

Further, the first power line noise filter of the invention detects noise occurring in each of two conductive lines of the electric power line, separately for each of the conductive lines; then generates phase-inverted signals separately for the two conductive lines, the phase-inverted signals respectively corresponding to the detected noises; and causes changes in electric current separately for the two conductive lines of the electric power line, the changes respectively corresponding to the phase-inverted signals generated for the two conductive lines. Therefore, according to the invention, it is possible to effectively reduce both normal mode noise and common mode noise in an electric power line.

The second power line noise filter of the invention detects noise in an electric power line by detecting variations in voltage in the electric power line; then generates a phase-inverted signal whose phase is inverted to that of the detected noise; and cancels the noise in the electric power line by causing a change in voltage in the electric power line corresponding to the phase-inverted signal. Therefore, according to the invention, it is possible to effectively reduce noise in an electric power line over a wide frequency band, and is also possible to effectively reduce sporadic noise as well as continuous noise.

Further, the second power line noise filter of the invention detects noises propagating through two conductive lines of the electric power line in the same phase, and causes the same changes in voltage for the two conductive lines of the electric power line. Therefore, according to the invention, it is possible to effectively reduce common mode noise in an electric power line, in particular.

Further, the second power line noise filter of the invention detects noise occurring in each of two conductive lines of the electric power line, separately for each of the conductive lines; then generates phase-inverted signals separately for the two conductive lines, the phase-inverted signals respectively corresponding to the noises detected for the two conductive lines; and causes changes in voltage separately for the two conductive lines of the electric power line, the changes respectively corresponding to the phase-inverted signals generated for the two conductive lines. Therefore, according to the invention, it is possible to effectively reduce both normal mode noise and common mode noise in an electric power line.

The third power line noise filter of the invention detects a first noise in an electric power line by detecting variations in electric current in the electric power line; then generates a first phase-inverted signal whose phase is inverted to that of the first noise detected; and cancels the first noise in the electric power line by causing a change in electric current in the electric power line corresponding to the first phase-inverted signal. The third power line noise filter also detects a second noise in the electric power line by detecting variations in voltage in the electric power line; then generates a second phase-inverted signal whose phase is inverted to that of the second noise detected; and cancels the second noise in the electric power line by causing a change in voltage in the electric power line corresponding to the second phase-inverted signal. Therefore, according to the invention, it is possible to effectively reduce noise in an electric power line over a wide frequency band, and is also possible to effectively reduce sporadic noise as well as continuous noise.

Further, the third power line noise filter of the invention detects first noises propagating through two conductive lines of the electric power line in the same phase, and causes the same changes in electric current for the two conductive lines of the electric power line. The power line noise filter also detects second noises propagating through two conductive lines of the electric power line in the same phase, and causes the same changes in voltage for the two conductive lines of the electric power line. Therefore, according to the invention, it is possible to effectively reduce common mode noise in an electric power line, in particular.

Further, the third power line noise filter of the invention detects a first noise occurring in each of two conductive lines of the electric power line, separately for each of the conductive lines; then generates first phase-inverted signals separately for the two conductive lines, the first phase-inverted signals respectively corresponding to the first noises detected for the two conductive lines; and causes changes in electric current separately for the two conductive lines of the electric power line, the changes respectively corresponding to the first phase-inverted signals generated for the two conductive lines. The third power line also detects a second noise occurring in each of two conductive lines of the electric power line, separately for each of the conductive lines; then generates second phase-inverted signals separately for the two conductive lines, the second phase-inverted signals respectively corresponding to the second noises detected for the two conductive lines; and causes changes in voltage separately for the two conductive lines of the electric power line, the changes respectively corresponding to the second phase-inverted signals generated for the two conductive lines. Therefore, according to the invention, it is possible to effectively reduce both normal mode noise and common mode noise in an electric power line.

In the fourth power line noise filter of the invention, the noise detection circuit (noise detection means) detects noise in an electric power line by detecting variations in electric current or voltage in the power line. Then, the phase-inverted signal generation circuit (phase-inverted signal generation means) generates a phase-inverted signal whose phase is inverted to that of the noise detected by the noise detection circuit (noise detection means). Then, the noise cancellation circuit (noise cancellation means) causes a change in electric current or voltage in the power line, the change corresponding to the phase-inverted signal. Further, in this noise filter, the peak-value-reducing impedance component reduces the peak value of noise on the noisecancellation-circuit(means)-side of the power line, and, keeps a difference in peak value between the noise on the noise-detection-circuit(means)-side of the power line and the noise on the noise-cancellation-circuit (means)-side of the power line. Therefore, according to the invention, it is possible to effectively reduce the noise on the noise-cancellation-circuit (means)-side of an electric power line.

Further, the fourth power line noise filter of the invention has a phase-adjusting impedance component having an impedance that adjusts a phase of the phase-inverted signal such that a phase difference between the noise inputted to the noise cancellation circuit (noise cancellation means) and the change in electric current or voltage in the electric power line caused by the noise cancellation circuit (noise cancellation means) is made closer to 180°. Therefore, according to the invention, it is possible to reduce the noise on the noise-cancellation-circuit (means)-side of the electric power line more effectively.

Obviously many modifications and variations of the present invention are possible in light of the above teachings. It is therefore to be understood that within the scope of the appended claims the invention may be practiced other than as specifically described.

What is claimed is:

1. A power line noise filter comprising:
    noise detection means for detecting a noise in an electric power line by detecting variations in electric current in the electric power line;
    phase-inverted signal generation means for generating a phase-inverted signal whose phase is inverted to that of the noise detected by the noise detection means; and
    noise cancellation means for canceling the noise in the electric power line by causing a change in electric current in the electric power line, the change corresponding to the phase-inverted signal generated by the phase-inverted signal generation means.

2. A power line noise filter according to claim 1, wherein:
    the noise detection means detects noises propagating through two conductive lines of the electric power line in the same phase; and
    the noise cancellation means causes the same changes in electric current for the two conductive lines of the electric power line.

3. A power line noise filter according to claim 1, wherein:
    the noise detection means detects noise occurring in each of two conductive lines of the electric power line, separately for each of the conductive lines;
    the phase-inverted signal generation means generates the phase-inverted signals separately for the two conductive lines, the phase-inverted signals respectively corresponding to the noises detected for the two conductive lines by the noise detection means; and
    the noise cancellation means causes changes in electric current separately for the two conductive lines of the electric power line, the changes respectively corresponding to the phase-inverted signals generated for the two conductive lines by the phase-inverted signal generation means.

4. A power line noise filter comprising:
    noise detection means for detecting a noise in an electric power line by detecting variations in voltage in the electric power line;
    phase-inverted signal generation means for generating a phase-inverted signal whose phase is inverted to that of the noise detected by the noise detection means; and
    noise cancellation means for canceling the noise in the electric power line by causing a change in voltage in the electric power line, the change corresponding to the phase-inverted signal generated by the phase-inverted signal generation means.

5. A power line noise filter according to claim 4, wherein:
    the noise detection means detects noises propagating through two conductive lines of the electric power line in the same phase; and
    the noise cancellation means causes the same changes in voltage for the two conductive lines of the electric power line.

6. A power line noise filter according to claim 4, wherein:
    the noise detection means detects noise occurring in each of two conductive lines of the electric power line, separately for each of the conductive lines;
    the phase-inverted signal generation means generates the phase-inverted signals separately for the two conductive lines, the phase-inverted signals respectively corresponding to the noises detected for the two conductive lines by the noise detection means; and
    the noise cancellation means causes changes in voltage separately for the two conductive lines of the electric power line, the changes respectively corresponding to the phase-inverted signals generated for the two conductive lines by the phase-inverted signal generation means.

7. A power line noise filter comprising:
    first noise detection means for detecting a first noise in an electric power line by detecting variations in electric current in the electric power line;
    first phase-inverted signal generation means for generating a first phase-inverted signal whose phase is inverted to that of the first noise detected by the first noise detection means;
    first noise cancellation means for canceling the first noise in the electric power line by causing a change in electric current in the electric power line, the change corresponding to the first phase-inverted signal generated by the first phase-inverted signal generation means;
    second noise detection means for detecting a second noise in the electric power line by detecting variations in voltage in the electric power line;
    second phase-inverted signal generation means for generating a second phase-inverted signal whose phase is inverted to that of the second noise detected by the second noise detection means; and
    second noise cancellation means for canceling the second noise in the electric power line by causing a change in voltage in the electric power line, the change corresponding to the second phase-inverted signal generated by the second phase-inverted signal generation means.

8. A power line noise filter according to claim 7, wherein:
    the first noise detection means detects first noises propagating through two conductive lines of the electric power line in the same phase;
    the first noise cancellation means causes the same changes in electric current for the two conductive lines of the electric power line;
    the second noise detection means detects second noises propagating through two conductive lines of the electric power line in the same phase; and
    the second noise cancellation means causes the same changes in voltage for the two conductive lines of the electric power line.

9. A power line noise filter according to claim 7, wherein:
    the first noise detection means detects the first noise occurring in each of two conductive lines of the electric power line, separately for each of the conductive lines;

the first phase-inverted signal generation means generates the first phase-inverted signals separately for the two conductive lines, the first phase-inverted signals respectively corresponding to the first noises detected for the two conductive lines by the first noise detection means;

the first noise cancellation means causes changes in electric current separately for the two conductive lines of the electric power line, the changes respectively corresponding to the first phase-inverted signals generated for the two conductive lines by the first phase-inverted signal generation means;

the second noise detection means detects the second noise occurring in each of two conductive lines of the electric power line, separately for each of the conductive lines;

the second phase-inverted signal generation means generates the second phase-inverted signals separately for the two conductive lines, the second phase-inverted signals respectively corresponding to the second noises detected for the two conductive lines by the second noise detection means; and the second noise cancellation means causes changes in voltage separately for the two conductive lines of the electric power line, the changes respectively corresponding to the second phase-inverted signals generated for the two conductive lines by the second phase-inverted signal generation means.

10. A power line noise filter comprising:

noise detection means, provided at a specific position on an electric power line, for detecting noise in the electric power line by detecting variations in electric current or voltage in the electric power line;

phase-inverted signal generation means for generating a phase-inverted signal whose phase is inverted to that of the noise detected by the noise detection means;

noise cancellation means, provided at a position on the electric power line different from that of the noise detection means, for canceling the noise in the electric power line by causing a change in electric current in the electric power line corresponding to the phase-inverted signal generated by the phase-inverted signal generation means, in the case where the noise detection means detects the noise by detecting variations in electric current in the electric power line; or by causing a change in voltage in the electric power line corresponding to the phase-inverted signal generated by the phase-inverted signal generation means, in the case where the noise detection means detects the noise by detecting variations in voltage in the electric power line; and a peak-value-reducing impedance component that is provided between the noise detection means and the noise cancellation means on the electric power line, and has an impedance that reduces a peak value of a noise passing therethrough.

11. A power line noise filter according to claim 10, wherein the peak-value-reducing impedance component includes an inductor.

12. A power line noise filter according to claim 10, further comprising a phase-adjusting impedance component that is provided along a signal path starting from the noise detection means to reach the noise cancellation means via the phase-inverted signal generation means, and has an impedance that adjusts a phase of the phase-inverted signal such that a phase difference between the noise inputted to the noise cancellation means and the change in electric current or voltage in the electric power line caused by the noise cancellation means is made closer to 180°.

13. A power line noise filter according to claim 12, wherein the phase-adjusting impedance component includes an inductor.

14. A power line noise filter comprising:

a noise detection circuit for detecting a noise in an electric power line by detecting variations in electric current in the electric power line;

a phase-inverted signal generation circuit for generating a phase-inverted signal whose phase is inverted to that of the noise detected by the noise detection circuit; and a noise cancellation circuit for canceling the noise in the electric power line by causing a change in electric current in the electric power line, the change corresponding to the phase-inverted signal generated by the phase-inverted signal generation circuit.

15. A power line noise filter according to claim 14, wherein:

the noise detection circuit detects noises propagating through two conductive lines of the electric power line in the same phase; and the noise cancellation circuit causes the same changes in electric current for the two conductive lines of the electric power line.

16. A power line noise filter according to claim 14, wherein:

the noise detection circuit detects noise occurring in each of two conductive lines of the electric power line, separately for each of the conductive lines;

the phase-inverted signal generation circuit generates the phase-inverted signals separately for the two conductive lines, the phase-inverted signals respectively corresponding to the noises detected for the two conductive lines by the noise detection circuit; and the noise cancellation circuit causes changes in electric current separately for the two conductive lines of the electric power line, the changes respectively corresponding to the phase-inverted signals generated for the two conductive lines by the phase-inverted signal generation circuit.

17. A power line noise filter comprising:

a noise detection circuit for detecting a noise in an electric power line by detecting variations in voltage in the electric power line;

a phase-inverted signal generation circuit for generating a phase-inverted signal whose phase is inverted to that of the noise detected by the noise detection circuit; and a noise cancellation circuit for canceling the noise in the electric power line by causing a change in voltage in the electric power line, the change corresponding to the phase-inverted signal generated by the phase-inverted signal generation circuit.

18. A power line noise filter according to claim 17, wherein:

the noise detection circuit detects noises propagating through two conductive lines of the electric power line in the same phase; and the noise cancellation circuit causes the same changes in voltage for the two conductive lines of the electric power line.

19. A power line noise filter according to claim 17, wherein:

the noise detection circuit detects noise occurring in each of two conductive lines of the electric power line, separately for each of the conductive lines;

the phase-inverted signal generation circuit generates the phase-inverted signals separately for the two conductive lines, the phase-inverted signals respectively corresponding to the noises detected for the two conductive lines by the noise detection circuit; and the noise cancellation circuit causes changes in voltage separately for the two conductive lines of the electric power line, the changes respectively corresponding to the phase-inverted signals generated for the two conductive lines by the phase-inverted signal generation circuit.

20. A power line noise filter comprising:

a first noise detection circuit for detecting a first noise in an electric power line by detecting variations in electric current in the electric power line;

a first phase-inverted signal generation circuit for generating a first phase-inverted signal whose phase is inverted to that of the first noise detected by the first noise detection circuit;

a first noise cancellation circuit for canceling the first noise in the electric power line by causing a change in electric current in the electric power line, the change corresponding to the first phase-inverted signal generated by the first phase-inverted signal generation circuit;

a second noise detection circuit for detecting a second noise in the electric power line by detecting variations in voltage in the electric power line;

a second phase-inverted signal generation circuit for generating a second phase-inverted signal whose phase is inverted to that of the second noise detected by the second noise detection circuit; and a second noise cancellation circuit for canceling the second noise in the electric power line by causing a change in voltage in the electric power line, the change corresponding to the second phase-inverted signal generated by the second phase-inverted signal generation circuit.

21. A power line noise filter according to claim 20, wherein:

the first noise detection circuit detects first noises propagating through two conductive lines of the electric power line in the same phase;

the first noise cancellation circuit causes the same changes in electric current for the two conductive lines of the electric power line;

the second noise detection circuit detects second noises propagating through two conductive lines of the electric power line in the same phase; and the second noise cancellation circuit causes the same changes in voltage for the two conductive lines of the electric power line.

22. A power line noise filter according to claim 20, wherein:

the first noise detection circuit detects the first noise occurring in each of two conductive lines of the electric power line, separately for each of the conductive lines;

the first phase-inverted signal generation circuit generates the first phase-inverted signals separately for the two conductive lines, the first phase-inverted signals respectively corresponding to the first noises detected for the two conductive lines by the first noise detection circuit;

the first noise cancellation circuit causes changes in electric current separately for the two conductive lines of the electric power line, the changes respectively corresponding to the first phase-inverted signals generated for the two conductive lines by the first phase-inverted signal generation circuit;

the second noise detection circuit detects the second noise occurring in each of two conductive lines of the electric power line, separately for each of the conductive lines;

the second phase-inverted signal generation circuit generates the second phase-inverted signals separately for the two conductive lines, the second phase-inverted signals respectively corresponding to the second noises detected for the two conductive lines by the second noise detection circuit; and the second noise cancellation circuit causes changes in voltage separately for the two conductive lines of the electric power line, the changes respectively corresponding to the second phase-inverted signals generated for the two conductive lines by the second phase-inverted signal generation circuit.

23. A power line noise filter comprising:

a noise detection circuit, provided at a specific position on an electric power line, for detecting noise in the electric power line by detecting variations in electric current or voltage in the electric power line;

a phase-inverted signal generation circuit for generating a phase-inverted signal whose phase is inverted to that of the noise detected by the noise detection circuit;

a noise cancellation circuit, provided at a position on the electric power line different from that of the noise detection circuit, for canceling the noise in the electric power line by causing a change in electric current in the electric power line corresponding to the phase-inverted signal generated by the phase-inverted signal generation circuit, in the case where the noise detection circuit detects the noise by detecting variations in electric current in the electric power line; or by causing a change in voltage in the electric power line corresponding to the phase-inverted signal generated by the phase-inverted signal generation circuit, in the case where the noise detection circuit detects the noise by detecting variations in voltage in the electric power line; and a peak-value-reducing impedance component that is provided between the noise detection circuit and the noise cancellation circuit on the electric power line, and has an impedance that reduces a peak value of a noise passing therethrough.

24. A power line noise filter according to claim 23, wherein the peak-value-reducing impedance component includes an inductor.

25. A power line noise filter according to claim 23, further comprising a phase-adjusting impedance component that is provided along a signal path starting from the noise detection circuit to reach the noise cancellation circuit via the phase-inverted signal generation circuit, and has an impedance that adjusts a phase of the phase-inverted signal such that a phase difference between the noise inputted to the noise cancellation circuit and the change in electric current or voltage in the electric power line caused by the noise cancellation circuit is made closer to 180°.

26. A power line noise filter according to claim 25, wherein the phase-adjusting impedance component includes an inductor.

* * * * *